United States Patent
Seki et al.

(10) Patent No.: US 10,620,532 B2
(45) Date of Patent: Apr. 14, 2020

(54) IMPRINT METHOD, IMPRINT APPARATUS, MOLD, AND ARTICLE MANUFACTURING METHOD

(71) Applicant: CANON KABUSHIKI KAISHA, Tokyo (JP)

(72) Inventors: Junichi Seki, Kawasaki (JP); Motoki Okinaka, Inagi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 780 days.

(21) Appl. No.: 14/921,112

(22) Filed: Oct. 23, 2015

(65) Prior Publication Data
US 2016/0129612 A1 May 12, 2016

(30) Foreign Application Priority Data

Nov. 11, 2014 (JP) ................................. 2014-229177
Sep. 1, 2015 (JP) ................................. 2015-172018

(51) Int. Cl.
*G03F 7/00* (2006.01)
*B29C 43/36* (2006.01)

(52) U.S. Cl.
CPC ........ G03F 7/0002 (2013.01); B29C 43/3642 (2013.01); *B29C 2043/3652* (2013.01)

(58) Field of Classification Search
None
See application file for complete search history.

(56) References Cited

U.S. PATENT DOCUMENTS

| | | | |
|---|---|---|---|
| 7,960,090 B2 | 6/2011 | Terasaki et al. | |
| 8,309,008 B2 * | 11/2012 | Choi | B82Y 10/00 264/319 |
| 9,201,298 B2 | 12/2015 | Nakagawa et al. | |
| 2004/0036201 A1 * | 2/2004 | Chou | B29C 33/62 264/402 |
| 2006/0172031 A1 * | 8/2006 | Babbs | B82Y 10/00 425/385 |
| 2007/0126156 A1 * | 6/2007 | Mahadevan | B82Y 10/00 264/334 |
| 2008/0106003 A1 * | 5/2008 | Chou | B29C 33/62 264/402 |

(Continued)

FOREIGN PATENT DOCUMENTS

| | | |
|---|---|---|
| CN | 101681095 A | 3/2010 |
| CN | 103048878 A | 4/2013 |

(Continued)

OTHER PUBLICATIONS

English translation of JP2014027075A (Year: 2014).*

(Continued)

*Primary Examiner* — Jacob T Minskey
*Assistant Examiner* — Baileigh Kate Darnell
(74) *Attorney, Agent, or Firm* — Rossi, Kimms & McDowell LLP

(57) ABSTRACT

Provided is an imprint method that molds an uncured resin applied to a substrate by a pattern portion formed on a mold and cures the uncured resin so as to form the pattern of the resin cured on the substrate. The imprint method includes a step of releasing the pattern portion from the resin such that two opposed boundaries are brought closer to each other to progress peeling while maintaining a parallel state after curing of the resin based on the assumption that the boundary at which the pattern portion is peeled from the resin is linear.

13 Claims, 17 Drawing Sheets

(56) References Cited

U.S. PATENT DOCUMENTS

| | | | | |
|---|---|---|---|---|
| 2009/0140445 A1* | 6/2009 | Lu | ....................... | B29C 43/003 264/40.1 |
| 2010/0072652 A1* | 3/2010 | GanapathiSubramanian | .............. | B82Y 10/00 264/101 |
| 2011/0042861 A1* | 2/2011 | Chou | ..................... | B29C 33/62 264/446 |
| 2012/0299222 A1* | 11/2012 | Lan | ...................... | G03F 7/0002 264/447 |
| 2013/0112097 A1* | 5/2013 | Nakagawa | ............ | G03F 7/0002 101/483 |
| 2014/0264989 A1* | 9/2014 | Chou | ................... | G01N 21/648 264/39 |

FOREIGN PATENT DOCUMENTS

| | | | |
|---|---|---|---|
| JP | 2007296683 A | 11/2007 | |
| JP | 2011077529 A | 4/2011 | |
| JP | 2011251526 A | 12/2011 | |
| JP | 2012134214 A | 7/2012 | |
| JP | 2013207180 A | 10/2013 | |
| JP | 2014027075 A | 2/2014 | |
| KR | 1020070102723 A | 10/2007 | |
| WO | WO-2006083520 A2 * | 8/2006 | ........... B25B 11/005 |
| WO | 2007126767 A2 | 11/2007 | |

OTHER PUBLICATIONS

Office Action issued in Chinese Patent Application No. 201510760851.0 dated May 26, 2017. English translation provided.

Li et al. "Theory and Simulations of Peel Demolding for Large-Area Nanoimprint Lithography", Sci Sin Tech, 2014, vol. 44, iss. 10; pp. 1087-1096. Cited in NPL 1. Partial English translation provided.

Office Action issued in Korean Appln. No. 10-2015-0153599 dated Dec. 12, 2018. English Translation provided.

Office Action issued in Japanese Appln. No. 2015-172018 dated May 28, 2019. English translation provided.

* cited by examiner

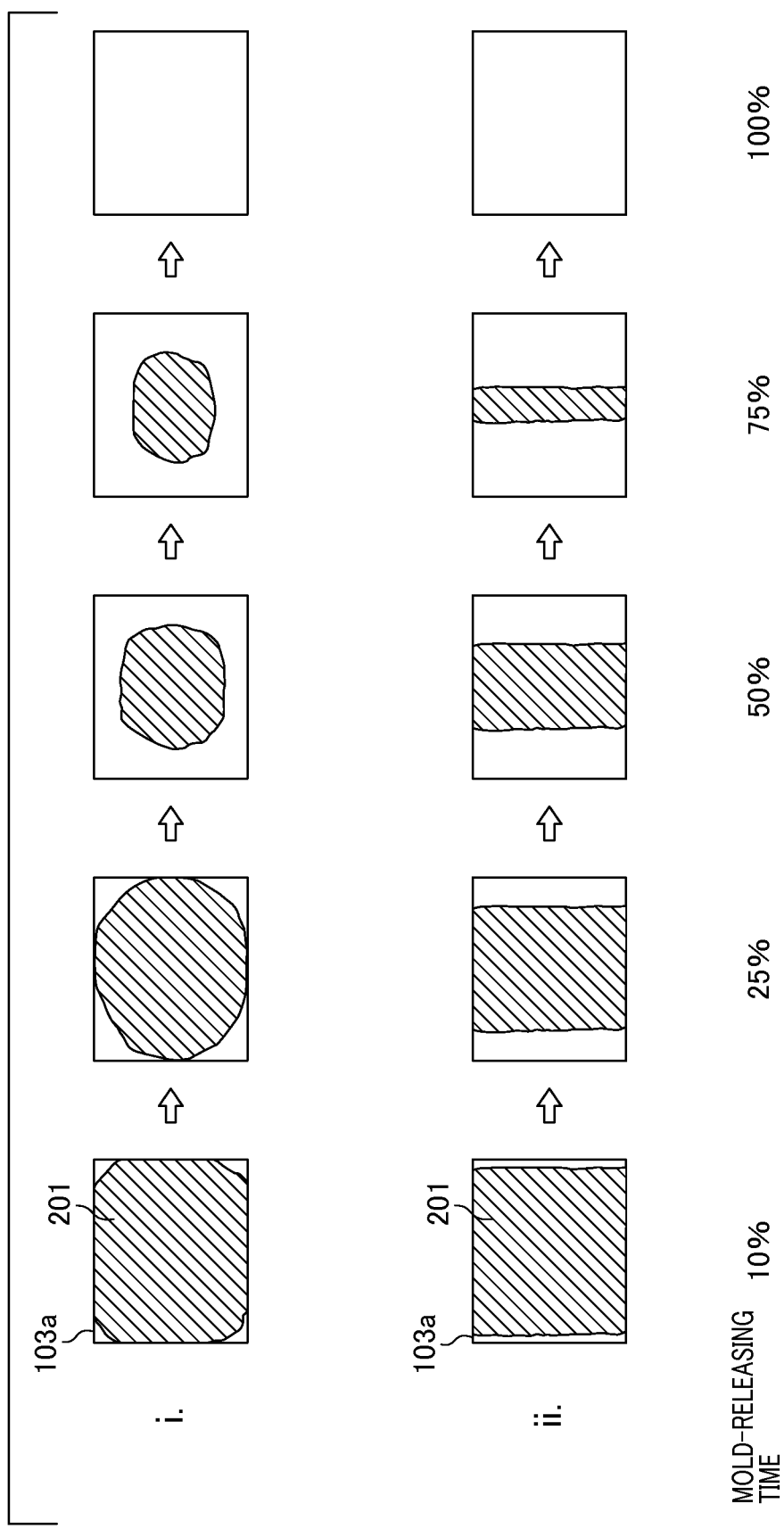

IMPRINT METHOD, IMPRINT APPARATUS, MOLD, AND ARTICLE MANUFACTURING METHOD

BACKGROUND OF THE INVENTION

Field of the Invention

The present invention relates to an imprint method, an imprint apparatus, a mold, and an article manufacturing method.

Description of the Related Art

A microfabrication technique is presented to form a pattern of an imprint material on a substrate by means of imprint processing for molding an imprint material applied to the substrate with use of a mold. This technique is also referred to as an "imprint technique", by which a fine pattern (structure) with dimensions of a few nanometers can be formed on a substrate. One example of imprint techniques includes a photo-curing method. First, an imprint apparatus employing the photo-curing method supplies a resin (photocurable resin) as an imprint material to one of shot regions on a substrate. Next, the photocurable resin on the substrate is molded with use of a mold. After the photocurable resin is irradiated with light for curing, the cured resin is released from the mold, whereby a resin pattern is formed on the substrate. The imprint technique includes not only a photo-curing method but also a heat-curing method for curing a resin with, for example, heat.

However, in such an imprint technique, a mold is brought into direct contact with a resin, which may lead to the occurrence of pattern defects such as transfer failure upon releasing the mold from the cured resin (mold-releasing). For example, the occurrence of defects often directly affects the device performance during the manufacture of a semiconductor device or the like, an acceptable defect density is very tight.

Accordingly, Japanese Patent Laid-Open No. 2011-77529 discloses an imprint apparatus that imparts stress to an interface by pressurizing the rear surface of a substrate or a mold to be in a convex shape upon mold-releasing and suppresses the occurrence of defects by reducing a mold-releasing force. Japanese Patent Laid-Open No. 2007-296683 discloses a pattern formation method that suppresses the occurrence of defects by aligning the line direction with the peel-off direction within a certain range. Japanese Patent Laid-Open No. 2013-207180 discloses an imprint method that reduces the occurrence of defects by setting the separation speed between a mold holder and a substrate holder to zero upon the start of mold-releasing.

In association with the development of a defect suppressing technique, it has been clarified in recent years that a defect density tends to particularly increase in the central portion of a molding region. One of causes for this is that a region where a defect density increases is a region where a mold is in contact with a resin until the latter part of the mold-releasing step and the speed of progress of peeling becomes very high in the region, resulting in the readily occurrence of a stress more than required to be applied to the resin pattern or the mold. In particular, in the technique disclosed in Japanese Patent Laid-Open No. 2011-77529 and Japanese Patent Laid-Open No. 2013-207180, it is also contemplated that peeling isotropically (substantially circularly) progresses from the peripheral portion towards the central portion of the molding region upon mold-releasing, and the speed of progress of peeling increases with decrease in the length of a peeling boundary, resulting in the frequent occurrence of a defect in the central portion. On the other hand, an application range of the technique disclosed in Japanese Patent Laid-Open No. 2007-296683 is limited to a directional pattern and it is unknown whether the technique may suppress the occurrence of defects in the central portion of the molding region. Furthermore, in the technique disclosed in Japanese Patent Laid-Open No. 2013-207180, the mold-releasing operation after the start of mold-releasing is performed by a spring force resulting from the elastic deformation of a mold or a substrate, the peeling may not progress until the mold-releasing operation is complete depending on the case where the mold-releasing force is large, the structure of the mold, or the like.

SUMMARY OF THE INVENTION

The present invention provides, for example, an imprint method that is advantageous for suppressing the occurrence of pattern defects.

According to an aspect of the present invention, an imprint method for forming a pattern on an imprint material applied to a substrate with use of a mold is provided that includes a step of releasing the mold from the imprint material such that two opposed boundaries are brought closer to each other while maintaining a linear state after curing of the imprint material based on the assumption that the boundaries at which the mold is peeled from the imprint material are linear lines.

Further features of the present invention will become apparent from the following description of exemplary embodiments with reference to the attached drawings.

BRIEF DESCRIPTION OF THE DRAWINGS

FIG. 8 is a diagram illustrating the progress of peeling of a resin in Comparative Example and the present embodiment in the same time series manner.

DESCRIPTION OF THE EMBODIMENTS

Hereinafter, preferred embodiments of the present invention will be described with reference to the drawings.

First Embodiment

Figure 1:
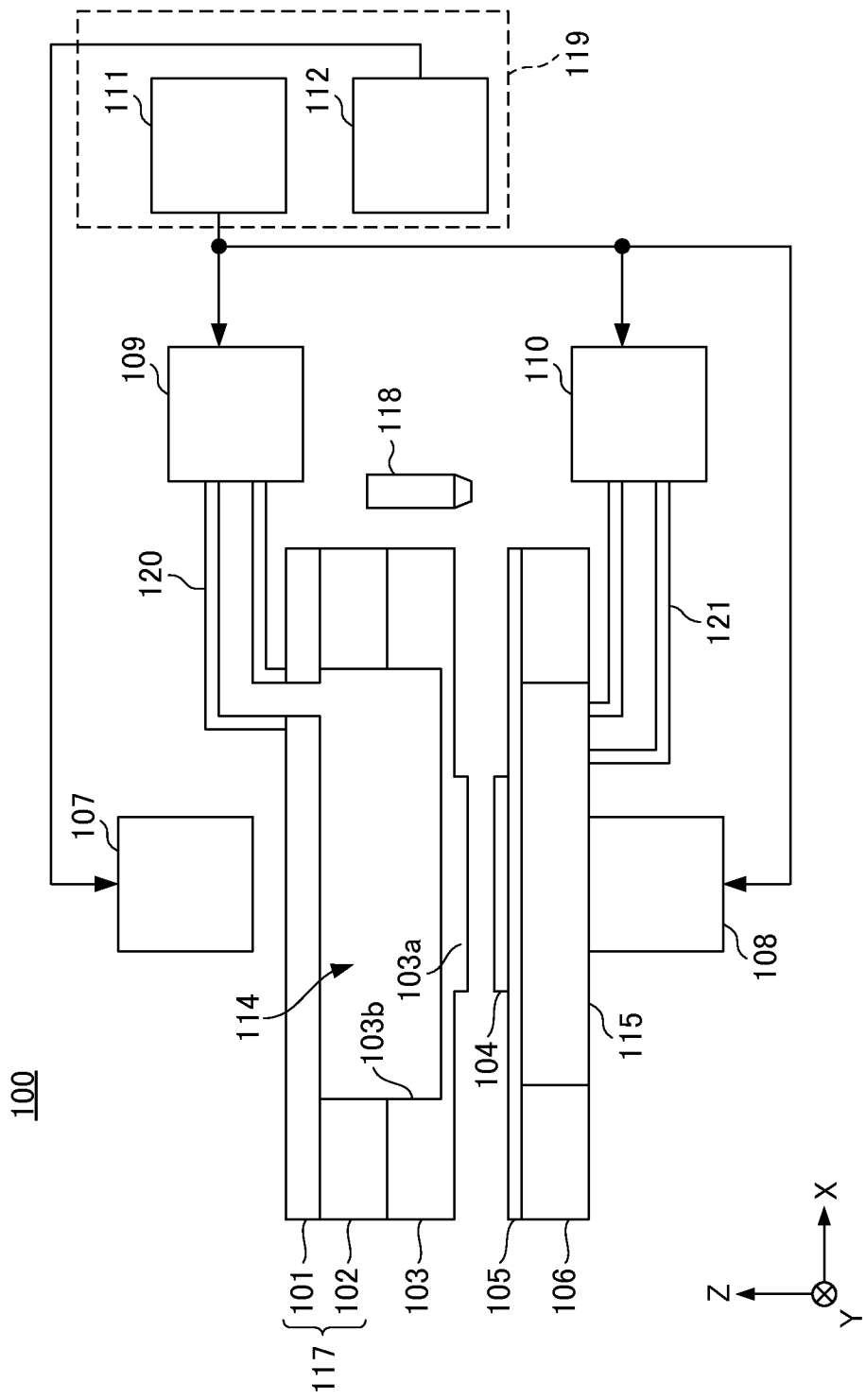
FIG. 1 is a diagram illustrating a configuration of an imprint apparatus according to a first embodiment of the present invention.

First, a description will be given of an imprint method and an imprint apparatus according to a first embodiment of the present invention. FIG. 1 is a schematic diagram illustrating a configuration of an imprint apparatus 100 according to the present embodiment. The imprint apparatus 100 is used in the manufacture of devices such as semiconductor devices and the like as articles. An uncured resin (imprint material) 104 applied to a wafer (substrate) 105 is brought into contact with a mold 103 so as to mold the resin 104, resulting formation of the pattern of the resin 104 on the wafer 105. Note that the imprint apparatus 100 employs a photo-curing method by way of example. In the following drawings, a description will be given where the Z axis is aligned in the perpendicular direction (the vertical direction) and mutually orthogonal axes X and Y are aligned in a plane perpendicular to the Z axis. The imprint apparatus 100 includes an illumination system 107, a mold holding mechanism (mold holder) 117, a substrate stage (substrate holder) 108, a dispenser 118, and a controller 119.

The illumination system 107 is a resin curing unit that irradiates the mold 103 with light (e.g., ultraviolet light) by adjusting the ultraviolet light emitted from a light source (not shown) to light suitable for curing the resin 104. The light source may be any light source as long as it emits not only ultraviolet light but also light having a wavelength that transmits through the mold 103 and cures the resin 104. For example, when the heat-curing method is employed, a heating unit for curing a thermosetting resin is disposed instead of the illumination system 107 as a resin curing unit in the vicinity of the substrate stage 108. On the other hand, when a thermoplastic resin is used instead of a thermosetting resin, the resin curing unit is, for example, a cooling unit that is disposed in the vicinity of the substrate stage.

The mold 103 includes a pattern portion 103a on which the three-dimensional concave-convex pattern to be transferred, such as a circuit pattern or the like is formed on the surface opposite to the wafer 105. The mold 103 includes a concave portion 103b in the central region of the surface at the side opposite to the surface on which the pattern portion 103a is provided. As the material of the mold 103, any optically transmissive material such as a quartz glass, a sapphire glass, or the like may be used in the case of employing the photo-curing method but a wide range of materials such as metals, silicon, ceramics, and the like may be selected in the case of employing the heat-curing method or the heat-plasticizing method.

The mold holding mechanism 117 has a mold chuck 102 for holding the mold 103, a mold drive mechanism (not shown) for supporting and moving the mold chuck 102, and a mold shape variable mechanism (mold shape variable unit) 114 capable of deforming the mold 103. The mold chuck 102 may hold the mold 103 by suctioning or attracting the outer periphery region of the surface of the mold 103 to be irradiated with ultraviolet light using a vacuum suction force or an electrostatic force. Also, each of the mold chuck 102 and the mold drive mechanism has an aperture region at the central portion (the inside thereof) such that ultraviolet light emitted from the illumination system 107 is directed toward the wafer 105 by passing through the mold 103. The aperture region communicates with the concave portion 103b formed in the mold 103. The mold drive mechanism moves the mold 103 in the Z axis direction so as to selectively bring the mold 103 into contact with the resin 104 on the wafer 105 or release the mold 103 from the resin 104. Note that the contact and release operation performed during imprint processing may be implemented by moving the mold 103 in the Z axis direction. The same operation may also be implemented by moving the wafer 105 in the Z axis direction under the drive of the substrate stage 108 or by relatively, simultaneously, or sequentially moving both of the mold 103 and the wafer 105. The mold shape variable mechanism 114 varies the shape of the mold 103 by applying a force (deformation force) to the mold 103 being held by the mold chuck 102.

Here, the mold shape variable mechanism 114 in the present embodiment is a fluid pressure applying unit that employs a method for applying a fluid pressure which is the pressure of a gas or liquid and particularly employs a method for varying the shape of the mold 103 by applying air pressure in the present embodiment. Note that the method for applying a fluid pressure is advantageous, for example, in the case of using a photocurable resin or in the case where various optical sensors, an imaging system, or the like is desired to be added for the purpose of fine process management because the method readily creates the transmission path of ultraviolet light within the imprint apparatus 100. The mold shape variable mechanism 114 further has a window plate 101 for sealing a space containing the concave portion 103b and the above aperture region, a mold shape controller 109, and a pipe 120 for bringing the mold shape controller 109 in communication with the sealed space. The material of the window plate 101 is, for example, quartz glass because of the necessity of transmitting ultraviolet light therethrough as in the mold 103. The mold shape controller 109 adjusts a pressure within the sealed space formed by the concave portion 103b as a portion based on the command given from the controller 119 and is, for example, a pump that performs pressurization or depressurization. While the mold shape variable mechanism 114 uses an air pressure in the present embodiment, the mold shape variable mechanism 114 may provide pressure control using a gas such as nitrogen or helium or may also provide liquid pressure control using liquid such as water or oil.

The wafer (substrate) 105 is a substrate to be processed consisting of, for example, single crystal silicon. For use in the manufacture of articles other than semiconductor devices, as the material of the substrate, an optical glass such as quartz may be employed for an optical element and GaN, SiC or the like may be employed for a light-emitting element.

The substrate stage 108 holds the wafer 105 and implements positional alignment between the mold 103 and the wafer 105 when the mold 103 is brought into contact with the resin 104 on the wafer 105. The substrate stage 108 has a substrate chuck 106 for holding the wafer 105, a stage drive mechanism (not shown) for supporting the substrate chuck 106 so as to move it in the X-Y-Z axial directions, and a wafer shape variable mechanism (substrate shape variable unit) 115 capable of deforming the wafer 105. In the present embodiment, in the wafer shape variable mechanism 115, the substrate chuck 106 is a vacuum chuck by way of example. The substrate chuck 106 employs a method that divides an adsorption region into a plurality of adsorption regions and varies the shape of the wafer 105 by pressurizing/depressurizing the adsorption pressure applied to each individual adsorption region. Here, in order to deform the shape of the wafer 105 into a shape different from the conventional one during a mold-releasing step to be described below in detail, a plurality of adsorption regions may be partitioned by a constant width in the X axis direction but communicate over the entire adsorption region in the Y axis direction. Note that, as in the mold shape controller 109, a pressure adjusting unit in each adsorption region may include a wafer shape controller 110 serving as a pump which performs pressurization or depressurization and a pipe 121 so as to adjust an air pressure.

The dispenser 118 applies (supplies) the resin 104 to a shot region serving as a pattern forming region preset on the wafer 105 with a desired application pattern. The resin 104 serving as the imprint material needs to have fluidity when it is filled between the mold 103 and the wafer 105 but to be solid for retaining its shape after being molded. In particular, in the present embodiment, the resin 104 is an ultraviolet light curable resin (photocurable resin) that exhibits curing properties to such a degree that when exposed to ultraviolet light, but a thermosetting resin, a thermoplastic resin, or the like may also be employed instead of a photocurable resin depending on various conditions such as article manufacturing processes.

The controller 119 is constituted by, for example, a computer or the like and is connected to the components of the imprint apparatus 100 through a line so as to control the operations and adjustment of the components by a program or the like. In particular, in the present embodiment, the controller 119 includes a drive control circuit 111 and a resin curing control circuit 112. The drive control circuit 111 controls the operation of the mold shape variable mechanism 114. The drive control circuit 111 controls the operations of the mold holding mechanism 117, the substrate stage 108, the mold shape controller 109, and the wafer shape controller 110 during, in particular, contact operation or release operation. The resin curing control circuit 112 controls irradiation from the illumination system 107. Note that the controller 119 may be integrated with the rest of the imprint apparatus 100 (provided in a shared housing) or may be provided separately from the rest of the imprint apparatus 100 (provided in a separate housing).

Next, a description will be given of imprint processing (imprint method) performed by the imprint apparatus 100. First, the controller 119 places and attaches the wafer 105 to the substrate chuck 106. Next, the controller 119 drives the substrate stage 108 to cause it to appropriately change the position of the wafer 105 and causes the alignment measurement system (not shown) to measure the alignment marks on the wafer 105 so as to detect the position of the wafer 105 with high accuracy. Then, the controller 119 determines an array of shot regions formed on a substrate based on the detection results. Here, as the flow of forming a pattern on one shot region, the controller 119 firstly causes the substrate stage 108 to perform positioning of an applying position on the wafer 105 under the resin ejection port of the dispenser 118. Then, the dispenser 118 applies the resin 104 to a shot region (applying step). Next, the controller 119 causes the substrate stage 108 to move the wafer 105 such that the shot region is placed in a contact position directly below the pattern portion 103a so as to achieve positioning. Next, the controller 119 performs a positional alignment between the pattern portion 103a and the shot region on the substrate, shape correction of the pattern portion 103a, and the like, and then drives the mold holding mechanism 117 so as to bring the pattern portion 103a into contact with the resin 104 applied to the shot region to fill the resin 104 in the pattern portion 103a (filling step). In this state, as a curing step, the controller 119 causes the illumination system 107 to emit ultraviolet light from the rear surface (upper surface) of the mold 103 for a predetermined time, and cures the resin 104 by the ultraviolet light that has been transmitted through the mold 103. Then, after the resin 104 is cured, the controller 119 drives the mold holding mechanism 117 so as to release the pattern portion 103a from the resin 104 that has been cured by enlarging the spacing between the mold 103 and the wafer 105 (mold-releasing step). By the aforementioned steps, a three dimensionally shaped resin pattern following the pattern portion 103a is formed on the shot region. Such a sequence of imprint operations is conducted two or more times while changing the shot region under the drive of the substrate stage 108, so that the imprint apparatus 100 can form a plurality of resin patterns on one wafer 105.

Figure 2:
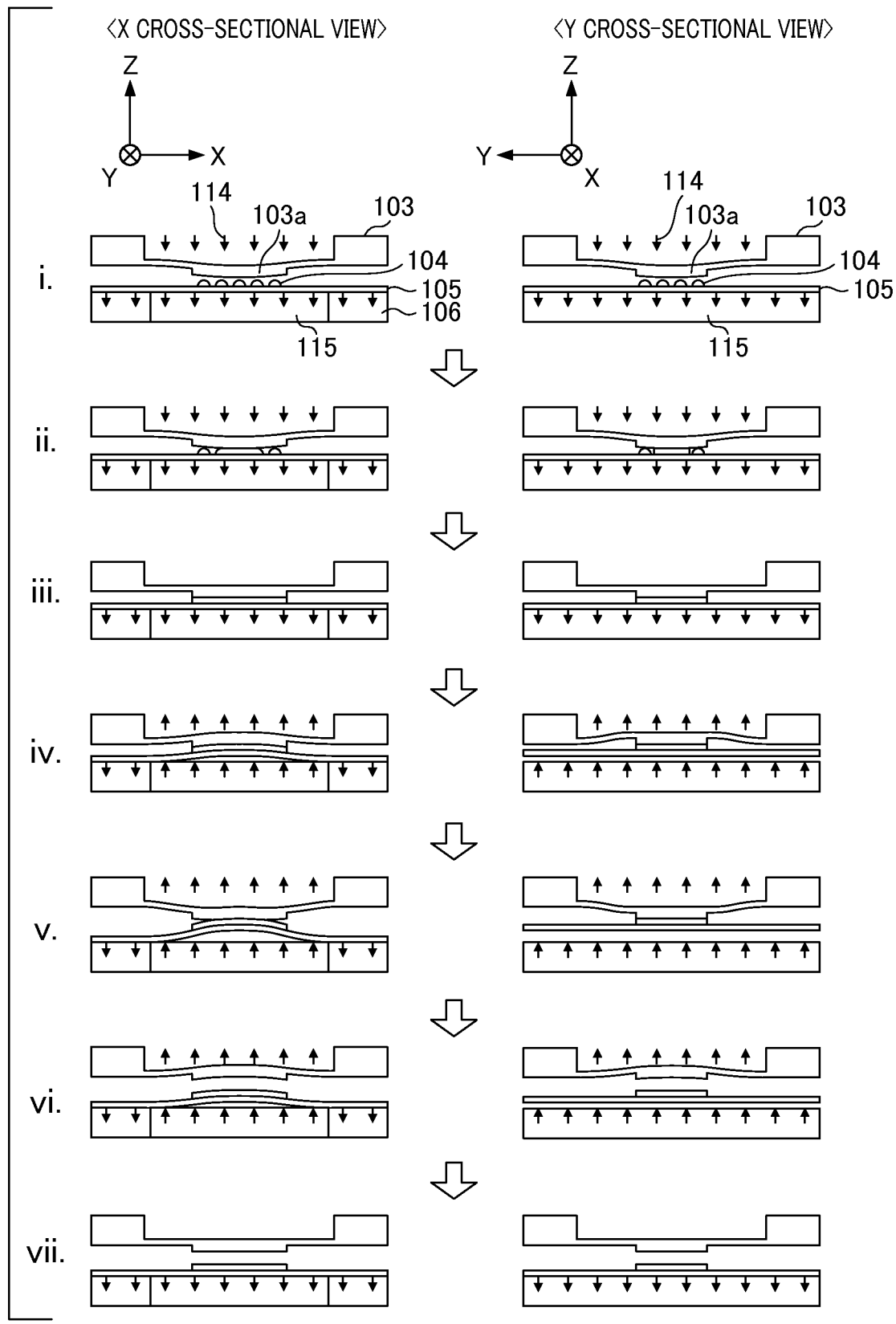
FIG. 2 is a diagram illustrating a state of the components or the like during imprint processing in a time series manner.

FIG. 2 is a schematic cross-sectional view illustrating the states (shapes) of the mold 103, the wafer 105, and the resin 104 on the wafer 105 in a time series manner in a sequence of steps of the above imprint processing. In FIG. 2, the cross-sectional view (X cross-sectional view) along the X axis direction and the cross-sectional view (Y cross-sectional view) along the Y axis direction passing through the position of the center of gravity of the mold 103 are arranged in parallel in a time series manner. Furthermore, in FIG. 2, the arrow indicates an orientation to which pressure is applied. FIGS. 3A to 3D are schematic plan views illustrating a change in state of the resin 104 at a time interval due to contact between the mold 103 and the resin 104 on the wafer 105. First, upon start of imprint processing, the mold 103 and the wafer 105 with the resin 104 applied to the surface thereof are arranged as opposed to each other.

Figure 3A:
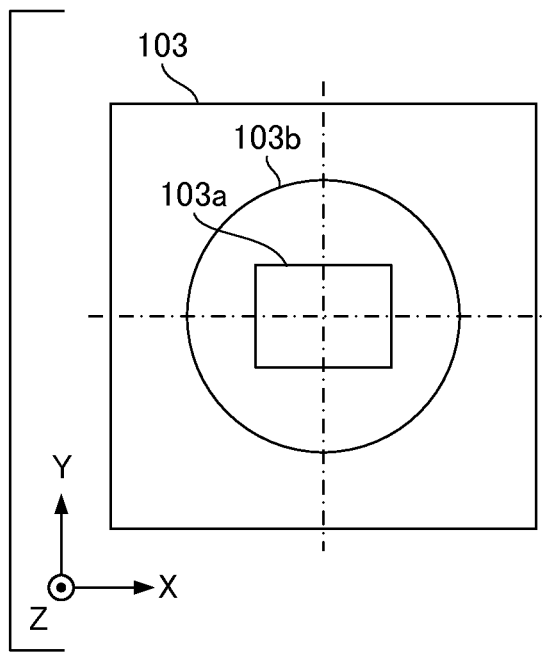
FIG. 3A is a diagram illustrating a state before a mold is brought into contact with a resin.

Next, as shown in (i) in FIG. 2, the mold shape variable mechanism 114 deforms the shape of the mold 103 into a substantially spherical convex shape such that the central portion of the pattern portion 103a of the mold 103 comes closer to the resin 104 side. At this time, since the mold 103 and the resin 104 are in a state prior to contact, there is no change in the state of the resin 104 as shown in FIG. 3A.

Figure 3B:
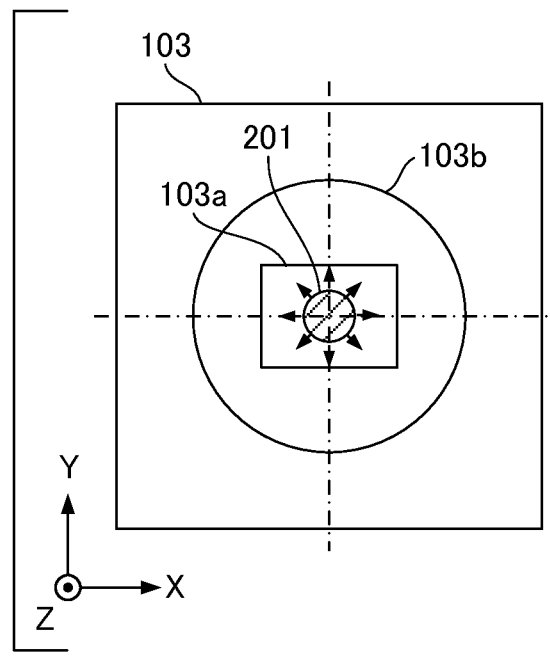
FIG. 3B is a diagram illustrating a state where a mold is in contact with a resin.
Figure 3C:
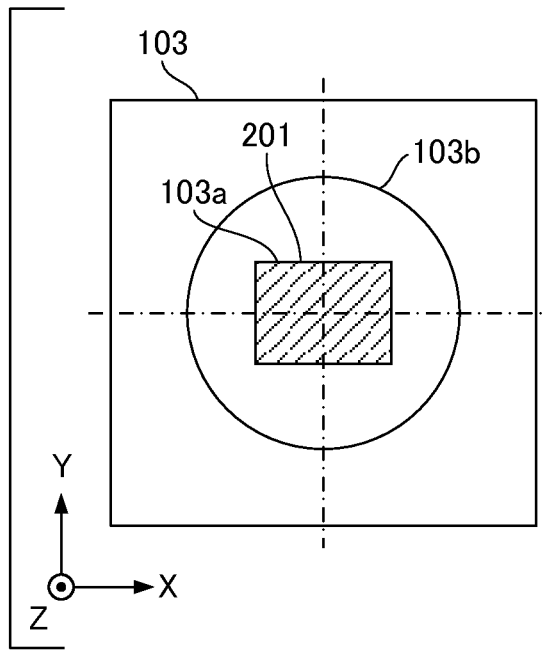
FIG. 3C is a diagram illustrating a state where a mold is completely filled with a resin by bringing the mold into contact with the resin.
Figure 3D:
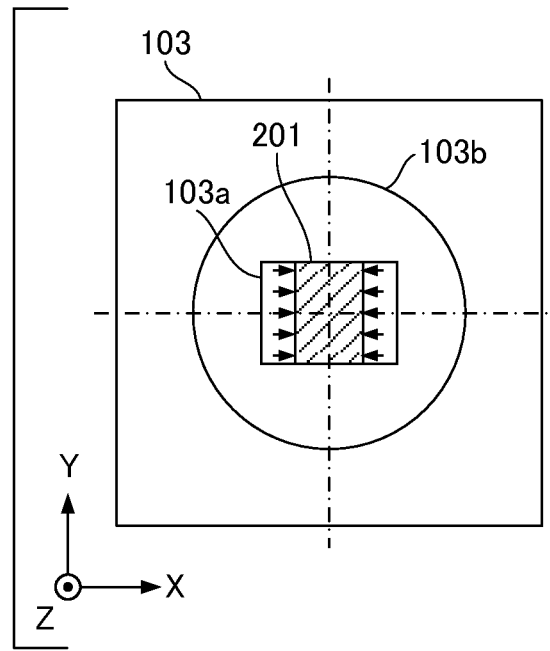
FIG. 3D is a diagram illustrating a state where a mold is in contact with a resin upon start of a mold-releasing step.

Next, as shown in (ii) in FIG. 2, the mold 103 and the wafer 105 gradually come closer to each other as a filling step, and then, the mold 103 (the pattern portion 103a) initiates contact with the resin 104. At this time, the mold shape variable mechanism 114 retains the shape of the mold 103 to a convex shape. In this manner, as shown in FIG. 3B, a contact region 201 becomes a circular shape and the filling of the resin 104 progresses from the central region towards the outer periphery region of the pattern portion 103a while displacing air therein, which is desirable from the viewpoint of suppressing the entanglement of air bubbles. In FIGS. 3B to 3D, the region (the contact region 201) in which the mold 103 is in contact with the resin 104 is indicated as a shaded region.

Next, as shown in (iii) in FIG. 2, after the resin 104 is completely filled over the entire pattern portion 103a (see FIG. 3C), the illumination system 107 cures the resin 104 by irradiating it with ultraviolet light of, for example, 100 mJ/cm$^2$ in a curing step. Here, the mold shape variable mechanism 114 is controlled such that the deformation of the mold 103 is gradually released as the filling of the resin 104 progresses (the progress of the filling operation) so as to return the shape of the mold 103 back to its original shape upon completion of the filling of the resin 104. While it is desirable that the mold shape variable mechanism 114 releases the deformation of the mold 103 from the viewpoint of suppressing strain of a resin pattern due to the deformation of the mold 103, the state where a deformation force is applied to the mold 103 may be maintained if the degree of strain is acceptable.

Next, as shown in (iv) in FIG. 2, the wafer shape variable mechanism 115 deforms the shape of the wafer 105 into a convex shape along a cylindrical shape such that the wafer 105 comes closer to the mold 103 side in parallel to one direction (hereinafter referred to as "deformation reference direction") within a plane (substrate deforming step). Note that the term "cylindrical shape" in the present embodiment refers to not only a strict cylindrical shape but also a so-called "substantially cylindrical shape". On the other hand, the mold shape variable mechanism 114 deforms the shape of the mold 103 into a concave shape such that the central portion of the mold 103 isotropically comes distant from the resin 104. In this case, the shape of the mold 103 is in a cylindrical shape so as to conform to the shape of the wafer 105 (mold deforming step). Here, since the Y axis direction is defined as the deformation reference direction (direction along which the axis of a cylindrical shape extends), only the central portion of the wafer 105 floats out of the substrate chuck 106 in the X cross-sectional view, whereas the entire wafer 105 floats out of the substrate chuck 106 in the Y cross-sectional view.

Next, as shown in (v) in FIG. 2, in a mold-releasing step, the mold 103 and the resin 104 on the wafer 105 are gradually released from each other. At this time, both the mold 103 and the wafer 105 are in a cylindrically deformed shape. Thus, as shown in FIG. 3D, the boundary (interface) upon peeling the mold 103 from the cured resin 104 is two linear lines along the deformation reference direction. The peeling progresses such that two opposed peeling boundaries are brought closer to each other while maintaining a linear state (the direction perpendicular to the deformation reference direction). Note that the state is maintained from the start of mold-releasing to the end of mold-releasing.

As shown in (vi) in FIG. 2, after completion of the mold-releasing step, the mold shape variable mechanism 114 and the wafer shape variable mechanism 115 stop application of the deformation force, and then the shapes of the mold 103 and the wafer 105 are respectively returned to their original shapes, so that the imprint processing is complete.

Figure 9:
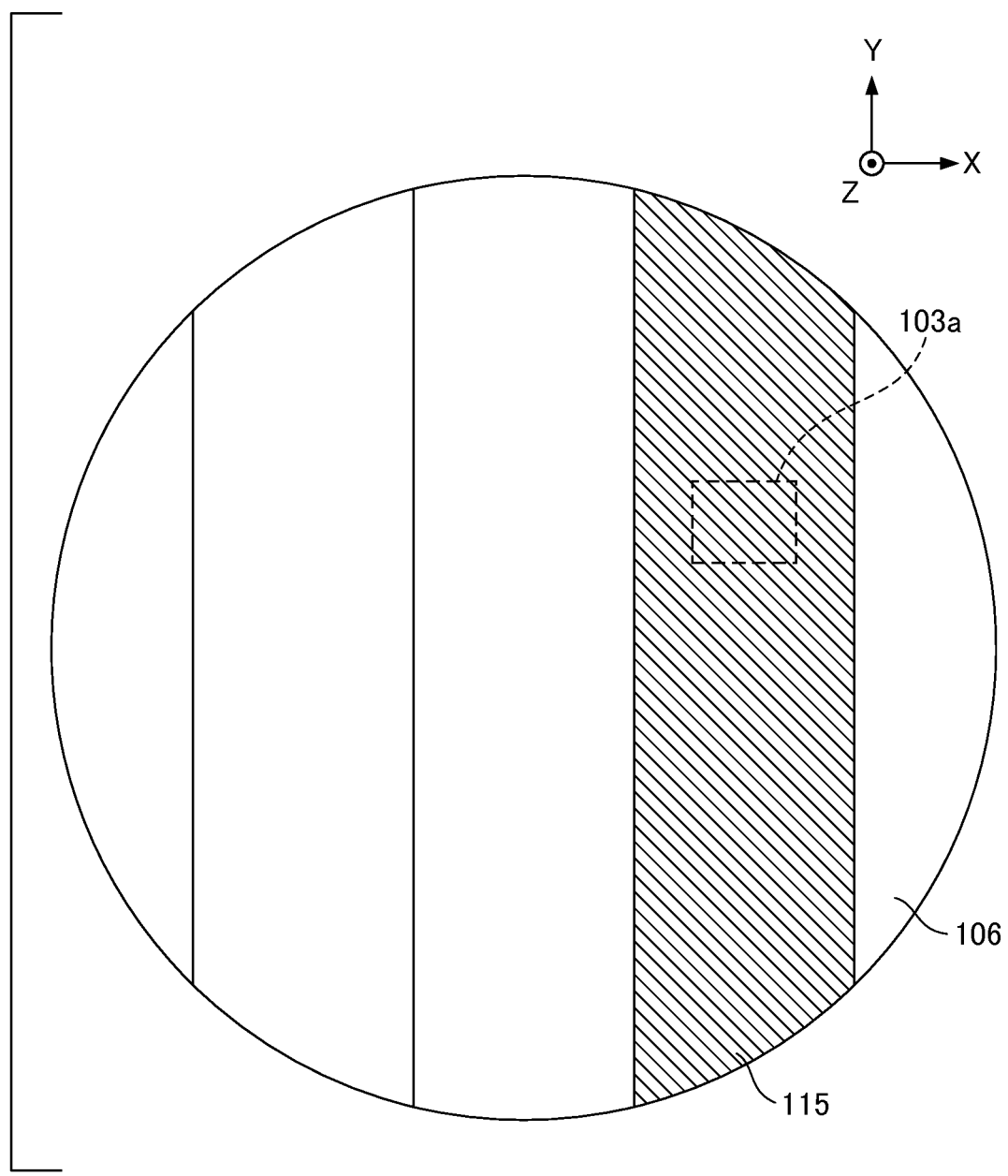
FIG. 9 is a diagram illustrating a substrate chuck.

Next, a specific description will be given by taking Comparative Example using numeral values in order to particularly clarify the effect of performing the mold-releasing step as described above. With respect to the mold-releasing step in Comparative Example, a description will be given by the same reference numerals for elements having the same configuration in the imprint apparatus 100 according to the present embodiment. First, as a common condition between the present embodiment and Comparative Example, the mold 103 consists of synthetic quartz having a thickness (dimension in the Z axis direction) of 5 mm, and includes a concave portion of which the external dimension (plane dimension) has a diameter φ of 65 mm and a depth of 4 mm at the surface at the side opposite to the surface on which the pattern portion 103a is provided. The pattern portion 103a is a convex portion, of which the external dimension has a length of 33 mm in the X axis direction, a length of 26 mm in the Y axis direction, and a height (dimension in the Z axis direction) of 0.1 mm, provided at the central portion of the surface thereof. The pattern portion 103a has a microstructure consisting of a concave-convex pattern formed on the entire surface thereof, and has a dimension with a width of 50 nm and a depth (dimension in the Z axis direction) of 100 nm on the average. A plurality of adsorption regions formed on the substrate chuck 106 serving as the wafer shape variable mechanism 115 is partitioned by a width of 70 mm in the X axis direction about the portion facing the pattern portion 103a as shown in the shaded portion in FIG. 9 but communicate over the entire adsorption region in the Y axis direction.

Figure 6A:
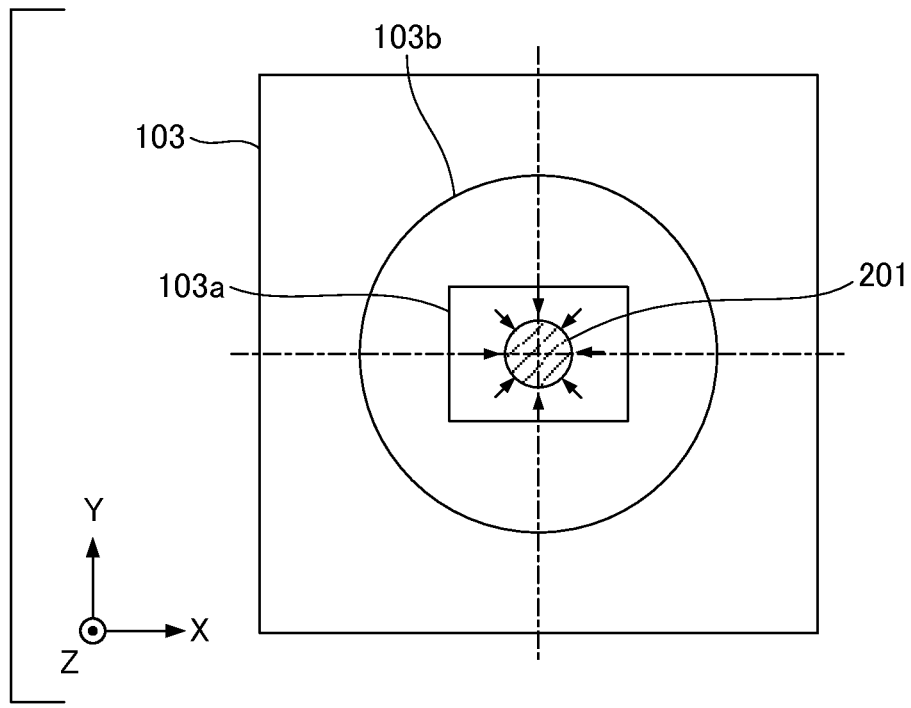
FIG. 6A is a plan view illustrating how peeling progresses in a mold-releasing step in Comparative Example.
Figure 6B:
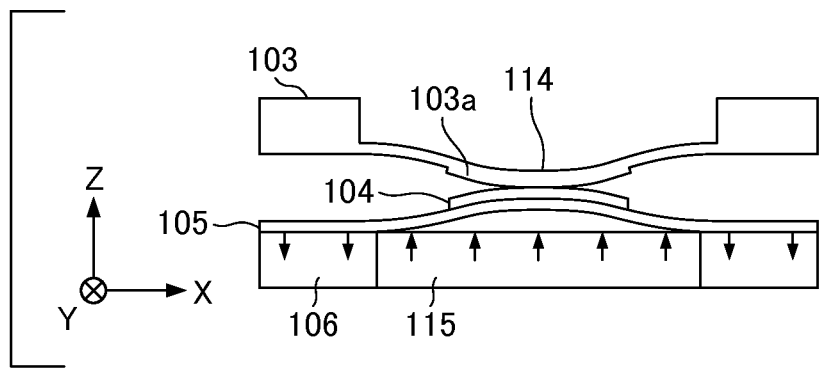
FIG. 6B is a cross-sectional view illustrating how peeling progresses in a mold-releasing step in Comparative Example.
Figure 6C:
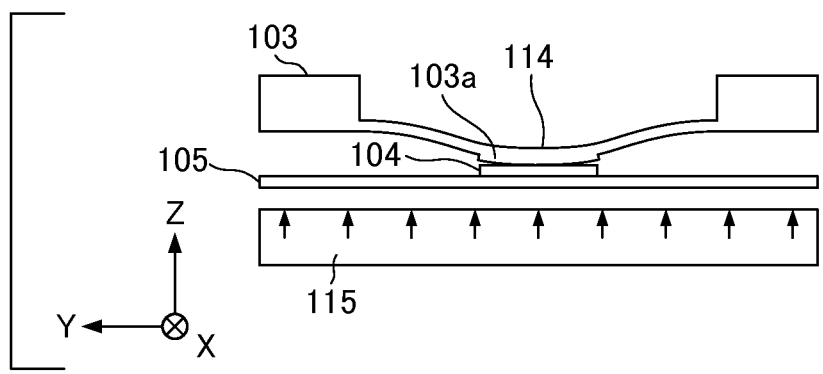
FIG. 6C is a cross-sectional view illustrating how peeling progresses in a mold-releasing step in Comparative Example.

FIGS. 6A to 6C are schematic views illustrating how peeling of the resin 104 progresses in a mold-releasing step in Comparative Example. Among them, FIG. 6A is a plan view. FIG. 6B is an X cross-sectional view where the state in this time particularly corresponds to the X cross-sectional view of (v) among the states during imprint processing in the present embodiment shown in FIG. 2. On the other hand, FIG. 6C is a Y cross-sectional view where the state in this time particularly corresponds to the Y cross-sectional view of (v) among the states during imprint processing in the present embodiment shown in FIG. 2. In a deforming step performed before the mold-releasing step after the curing step, both the mold shape variable mechanism 114 and the wafer shape variable mechanism 115 apply an air pressure of +10 kPa so as to deform the mold 103 and the wafer 105 about the portion facing the pattern portion 103a. It should be noted that, in the case of Comparative Example, the mold shape variable mechanism 114 deforms the shape of the mold 103 into a convex shape such that the central portion of the mold 103 isotropically comes closer to the wafer 105 side. In this state, the mold 103 and the resin 104 on the wafer 105 are released from each other at a speed of 100 μm/s in the mold-releasing step. In this manner, the mold 103 is isotropically deformed as shown in FIGS. 6B and 6C so as not to follow the cylindrical shape of the wafer 105. Thus, the contact region 201 becomes a circular shape (substantially circular shape) as shown in FIG. 6A during the mold-releasing step, so that peeling isotropically progresses from the outer periphery towards the center of the pattern portion 103a.

In contrast, in the present embodiment, in a deforming step, for example, the mold shape variable mechanism 114 applies an air pressure of −10 kPa so as to deform the mold 103. On the other hand, the wafer shape variable mechanism 115 applies an air pressure of +10 kPa so as to deform the wafer 105. Here, the wafer shape variable mechanism 115 deforms the shape of the wafer 105 into a cylindrical shape as described above. At this time, as shown in the X cross-sectional view of (iv) in FIG. 2, the wafer shape variable mechanism 115 pressurizes an adsorption region including the portion facing the pattern portion 103a in the X axis direction but adsorbs (depressurizes) the other adsorption region. On the other hand, as shown in the Y cross-sectional view of (iv) in FIG. 2, the entire region in the Y axis direction including the portion facing the pattern portion 103a in the Y axis direction is in a pressurized state. In contrast, the entire region (not shown) in the Y axis direction at both ends in the X axis direction not including the portion facing the pattern portion 103a is in an adsorbed state. From this state, it is assumed that, in the mold-releasing step, the mold 103 and the resin 104 on the wafer 105 are released from each other at a speed of 100 μm/s as in Comparative Example. In this manner, peeling of the mold 103 from the wafer 105 progresses as has been described above with reference to (v) in FIG. 2 and FIG. 3D.

Figure 7A:
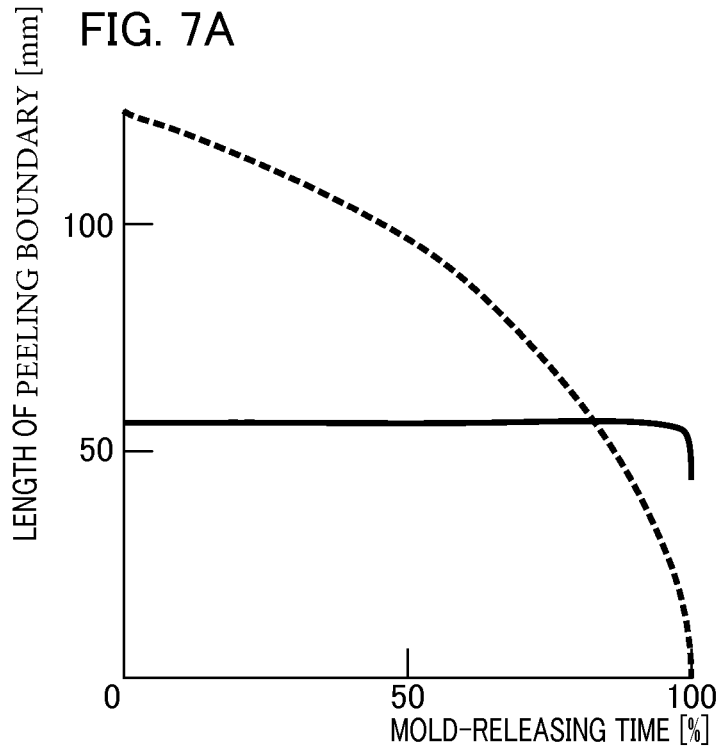
FIG. 7A is a graph illustrating the length of a peeling boundary.
Figure 7B:
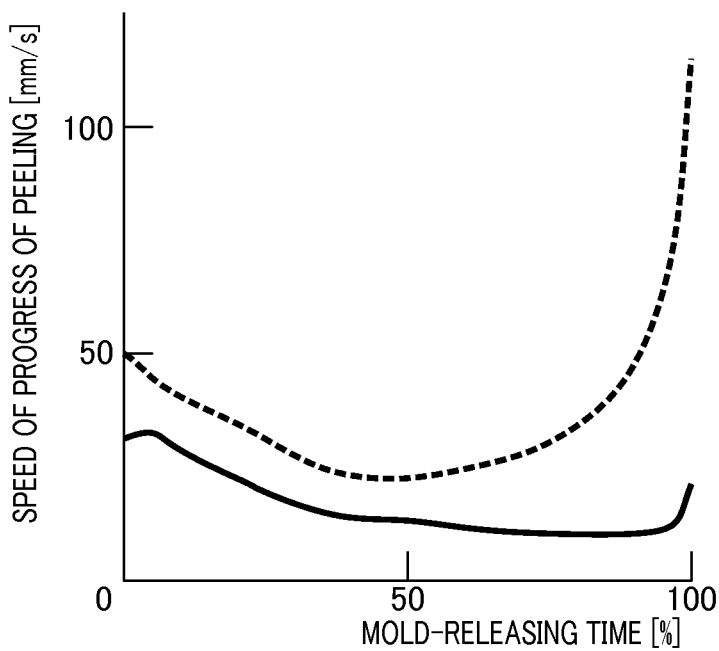
FIG. 7B is a graph illustrating the speed of progress of peeling.

FIGS. 7A and 7B is graphs respectively illustrating the length of a peeling boundary and the speed of progress of peeling with respect to a mold-releasing time, which are obtained by taking pictures of the status of peeling by a high-speed camera under the above condition and performing image analysis, for the progress of peeling of the resin 104 in Comparative Example and the present embodiment, respectively. Among them, FIG. 7A shows the length of a peeling boundary and FIG. 7B shows the speed of progress of peeling. In FIGS. 7A and 7B, the solid line indicates a value in the present embodiment and the broken line indicates a value in Comparative Example.

First, when the mold-releasing step is performed by the imprint method according to the present embodiment, two linear boundaries are formed, and thus, the length of boundary shown in FIG. 7A was maintained at a substantially constant level of about 52 mm which is two times longer than the shorter side length (26 mm) of the pattern portion 103a. On the other hand, the speed of progress of peeling shown in FIG. 7B exhibited a slight rise in the early and late stages of the mold-releasing step but was maintained at a substantially constant level of 30 mm/s or less. Among the resin patterns formed on the wafer 105 using such an imprint method, there is no particular change in the defect density in the portion formed on the central portion of the pattern portion 103a as compared with other portions.

Next, when the mold-releasing step is performed by the imprint method in Comparative Example, the length of boundary shown in FIG. 7A was rapidly decreased with decrease in the radius of the contact region 201. On the other hand, the speed of progress of peeling shown in FIG. 7B exhibited a slight decrease in the early stage of the mold-releasing step but an increase in the medium stage and a sharp rise in the late stage, and finally indicated a high value of about 120 mm/s or greater. Among the resin patterns formed on the wafer 105 using the imprint method in Comparative Example, the defect density in the portion formed on the central portion of the pattern portion 103a was three times greater than that of the peripheral portion. Also, in the other portions, the defect density in the portion formed on the central portion of the pattern portion 103a was 1.2 times greater as compared with the case of the present embodiment. The same results in Comparative Example are obtained in the case where only the wafer shape variable mechanism 115 is placed in an atmospheric pressure and in the case where only the mold shape variable mechanism 114 is placed in an atmospheric pressure during the mold-releasing step.

FIG. 8 is schematic plan views illustrating the progress of peeling of the resin 104 (change in the contact region 201) in Comparative Example and the present embodiment in the same time series manner. (i) of FIG. 8 corresponds to the case in Comparative Example and (ii) of FIG. 8 corresponds to the case in the present embodiment. Referring to the relationship with a mold-releasing time shown in FIGS. 7A and 7B, first, there is a sharp decrease in the contact region 201 in the late stage of the mold-releasing step in Comparative Example. In contrast, in the case of the present embodiment, there is a small change in the speed of progress of peeling while substantially maintaining the length of a peeling boundary during the mold-releasing step as is shown in graph in FIGS. 7A and 7B.

As described above, the imprint method and the imprint apparatus 100 according to the present embodiment have the advantages as follows. First, a decrease in the length of a peeling boundary for supporting a peeling force is suppressed during the mold-releasing step, so that an increase in the speed of progress of peeling can be suppressed. In particular, in the above example, the boundaries for the molding region of which the plane shape is a rectangle are formed while maintaining two opposing sides parallel to each other, so that the length of boundary is kept at constant length. In this manner, the amount of the region (the region where the speed of progress of peeling is high) where the defect density increases in the molding region decreases, resulting in suppressing the occurrence of pattern defects as much as possible. Even if the molding region is in other shape such as a circle, a polygon, or the like or has a different boundary angle, a change in the length of boundary occurs but the length of boundary does not extremely decrease as that described in Comparative Example, whereby the same effect as in the above description is provided. This leads to elimination of complex and high-speed speed control, resulting in a contribution to cost reduction due to simplified control of the apparatus. As shown in (iv) in FIG. 2, peeling progresses in a state where the mold 103 and the wafer 105 having the radius of curvature of the size close to each other are bent near the boundaries in the same direction, so that the interference of the pattern shape due to the mismatch in bending hardly occurs as compared with Comparative Example. Thus, a stress applied to the resin pattern in the molding surface direction due to the above cause is suppressed. In the present embodiment, peeling symmetrically progresses along two boundaries, forces applied to both boundaries in the molding surface direction are cancelled, a stress applied to the resin pattern in the molding surface direction is suppressed as compared with the case where peeling progresses from one side in Comparative Example. This may leads to a contribution to cost reduction due to simplified rigidity of the apparatus. Furthermore, the imprint method and the imprint apparatus 100 according to the present embodiment are readily modified from the imprint apparatus of conventional structure, and thus, have a wide range of applications.

As described above, according to the present embodiment, an imprint method that is advantageous for suppressing the occurrence of pattern defects may be provided.

Second Embodiment

Next, a description will be given of an imprint method and an imprint apparatus according to a second embodiment of the present invention. In the first embodiment, a description has been given of the case where the mold 103 or the wafer 105 is deformed by using an air pressure (fluid pressure) together with the mold shape variable mechanism 114 and the wafer shape variable mechanism 115. In contrast, the feature of the present embodiment lies in the fact that the mold shape variable mechanism and the wafer shape variable mechanism employ a method that causes the drive mechanism to bring in contact with an object to be moved so as to apply a mechanical external force thereto.

Figure 4A:
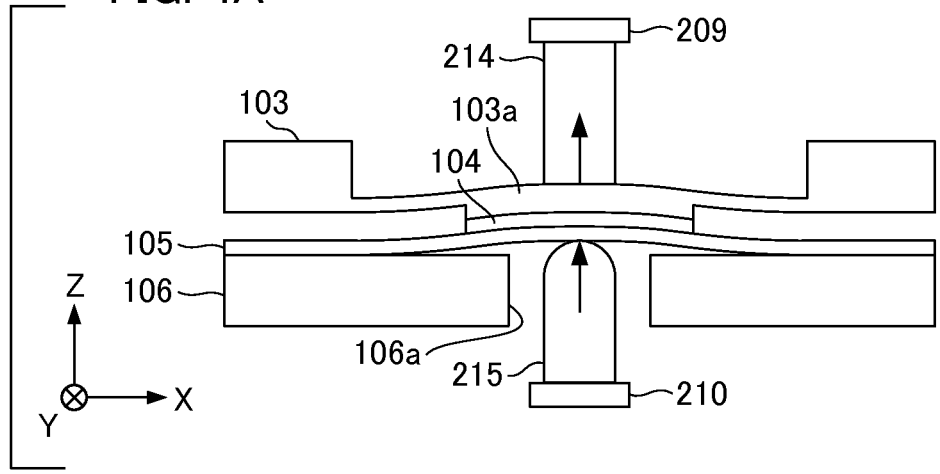
FIG. 4A is a cross-sectional view illustrating a configuration of an imprint apparatus according to a second embodiment of the present invention.
Figure 4B:
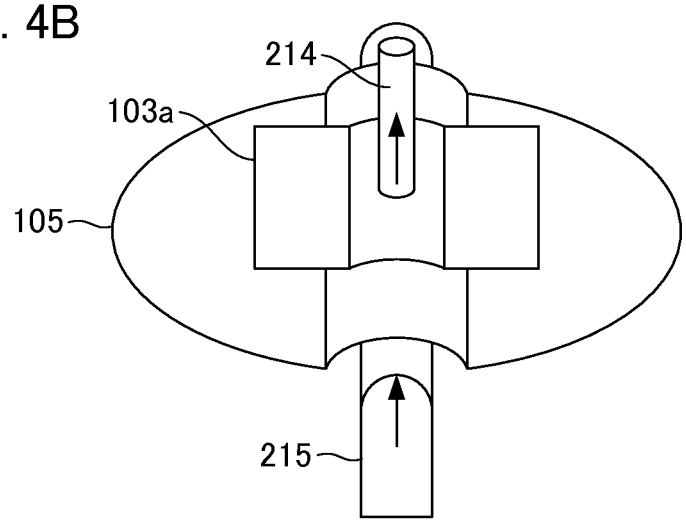
FIG. 4B is a perspective view illustrating a configuration of the imprint apparatus according to the second embodiment of the present invention.
Figure 4C:
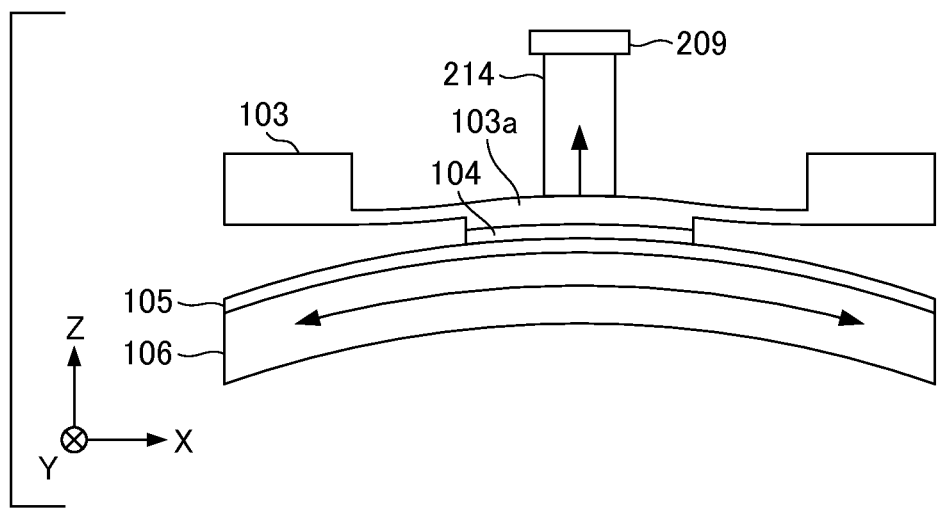
FIG. 4C is a cross-sectional view illustrating a configuration of the imprint apparatus according to the second embodiment of the present invention.

FIGS. 4A to 4C are schematic diagrams illustrating a configuration of a mold shape variable mechanism 214 and a wafer shape variable mechanism 215 in the imprint apparatus according to the present embodiment. Among them, FIG. 4A is an X cross-sectional view, FIG. 4B is a perspective view, and FIG. 4C is an X cross-sectional view illustrating still another example. In the present embodiment, the components corresponding to or similar to those in the first embodiment are designated by the same reference numerals, and therefore, its explanation will be omitted.

The mold shape variable mechanism 214 is a pillar made of, for example, quartz glass having a diameter of 5 mm, and adhesively secured to the opposite side (rear surface side) of the central portion of the pattern portion 103a of the mold 103 with the central axis of the pillar in parallel to the Z axis. In this case, a mold shape controller 209 is a driving unit that is capable of moving (linearly moving) the pillar along the Z axis direction. As the drive mechanism, a linear motor, an air pressure actuator, or the like may be employed.

The wafer shape variable mechanism 215 is an upthrust member that is capable of upthrusting the wafer 105 being held on the substrate chuck 106 by a contact from the rear surface of the wafer 105. If the Y axis direction is defined as the deformation reference direction, the upthrust member is a member of substantially rectangular parallelepiped shape having a width of 5 mm in the X axis direction and a length of greater than the wafer 105 in the Y axis direction. In order to prevent the wafer 105 from being damaged upon contact (upthrust), the cross-section of the portion of the upthrust member, where it brings in contact with the rear surface of the wafer 105, is rounded off in an arcuate shape. In this case, a wafer shape controller 210 is a driving unit that is capable of moving the upthrust member along the Z axis direction. As the drive mechanism, a linear motor, an air pressure actuator, or the like may be employed. In order to enable the wafer shape variable mechanism 215 to perform such an upthrust operation, the substrate chuck 106 has an opening 106a having width of 70 mm in the X axis direction but extending across the Y axis direction about the portion facing the pattern portion 103a. The wafer shape variable mechanism 215 may move by penetrating through the opening 106a in a non-contact manner.

With the above-described configuration, in the mold-releasing step in the present embodiment, the mold shape variable mechanism 214 deforms the mold 103 by moving the mold 103 by 20 μm in a direction away from the resin 104 on the wafer 105. On the other hand, the wafer shape variable mechanism 215 deforms the wafer 105 by moving the wafer 105 by 20 μm towards the mold 103. In this manner, in the present embodiment, peeling of the resin 104 progresses as in the first embodiment, and thus, the same effects as those of the first embodiment can be obtained. In particular, according to the present embodiment, the amount of deformation of the mold 103 and the wafer 105 in the mold-releasing step is uniquely defined due to the mechanical constraint, which is particularly effective when the variance in behavior of mold-releasing is large due to the material of the resin 104, the status of the transfer pattern, or the like. In addition, the shape variable mechanisms 214 and 215 are both solid members, which is particularly effective when imprint processing is performed in a vacuum.

In the present invention, the method for applying a mechanical external force caused by contact in the mold-releasing step is not limited to the above method. For example, the wafer shape variable mechanism 215 may be configured such that the substrate chuck 106 itself bends to be a substantially cylindrical shape as shown in the X cross-sectional view in FIG. 4C. In other words, in this case, the substrate chuck 106 also serves as the wafer shape variable mechanism 215.

Third Embodiment

Next, a description will be given of an imprint method and an imprint apparatus according to a third embodiment of the present invention. In the first embodiment, a description has been given of the case where the mold shape variable mechanism 114 deforms the mold 103 using an air pressure (fluid pressure). In contrast, the feature of the present embodiment lies in the fact that the mold shape variable mechanism or the wafer shape variable mechanism employs a method that applies a remote force by generating an electric field or a magnetic field. Hereinafter, a description will be given, by way of example, of the case where the mold shape variable mechanism is a remote force applying unit that employs a method for applying a remote force by generating an electric field.

Figure 5:
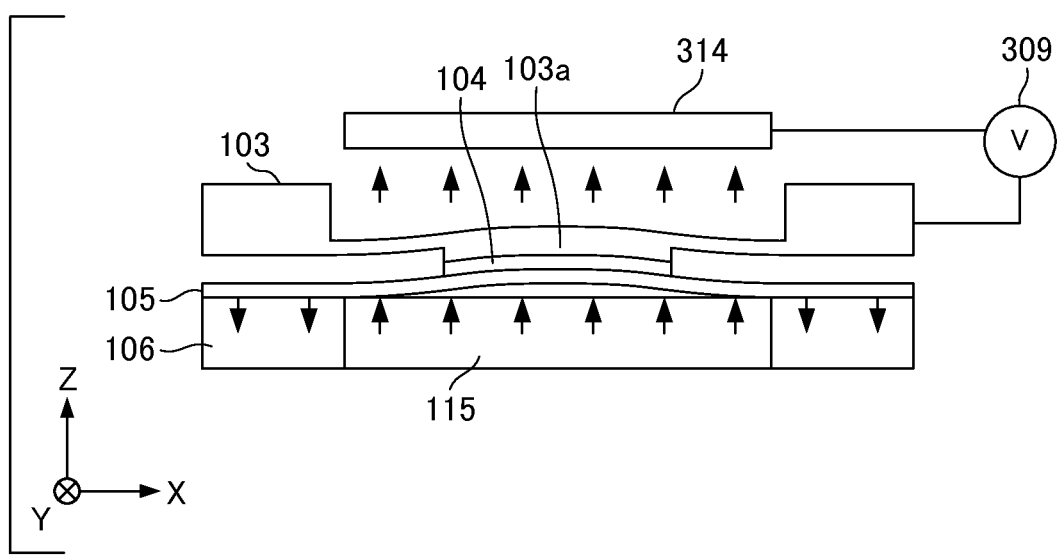
FIG. 5 is a diagram illustrating a configuration of an imprint apparatus according to a third embodiment of the present invention.

FIG. 5 is a schematic view (X cross-sectional view) illustrating a configuration of a mold shape variable mechanism 314 and a wafer shape variable mechanism 115 among the configuration of the imprint apparatus according to the present embodiment. In the present embodiment, the components corresponding to or similar to those in the first embodiment are designated by the same reference numerals, and therefore, its explanation will be omitted. The mold shape variable mechanism 314 is a circular metal plate having, for example, a diameter of 50 mm which is disposed so as to face the pattern portion 103a on the light-emission-side of the mold 103. On the other hand, an ITO layer which is a transparent electrode is deposited on the rear surface of the mold 103 facing the metal plate. In this case, a mold shape controller 309 is a voltage source (voltage applying unit) that is connected to the metal plate serving as the mold shape variable mechanism 314 and the ITO layer on the rear surface of the mold 103 via electrical wiring. Note that the wafer shape variable mechanism 115 is the same as that in the first embodiment.

With the above-described configuration, in the mold-releasing step in the present embodiment, the wafer shape variable mechanism 115 deforms the wafer 105 by applying an air pressure of +10 kPa as in the first embodiment. Then, the mold shape controller 309 applies a voltage of opposite polarity to the mold shape variable mechanism 314 and the ITO layer so as to deform the mold 103 with the maximum displacement of 20 µm as in the first embodiment to conform to the shape of the wafer 105. In this manner, in the present embodiment, peeling of the resin 104 progresses as in the first embodiment, and thus, the same effects as those of the first embodiment can be obtained. In particular, according to the present embodiment, the deformation of the mold 103 is performed by an electrical signal and a physical field, which is effective when a high speed response is required in the case of fast-cycle imprint processing. The mold shape variable mechanism 314 is in non-contact with the mold 103 which is an object to be deformed, which is particularly effective depending on an imprint processing method, in particular, when imprint processing is performed in a vacuum.

In the above embodiments, in the mold-releasing step, the wafer shape variable mechanism deforms the shape of the wafer 105 into a convex shape along a cylindrical shape and the mold shape variable mechanism deforms the mold 103 so as to conform to the shape of the wafer 105. However, the present invention is not limited to the method or structural configuration provided that peeling can progress such that two opposed peeling boundaries are brought closer to each other while maintaining a linear state in a parallel state based on the assumption that the peeling boundaries are linear lines. In other words, in the reverse of the above, the present invention may also be applicable to the method or structural configuration such that, in the mold-releasing step, the mold shape variable mechanism may deform the shape of the mold 103 into a convex shape along a cylindrical shape and the wafer shape variable mechanism may deform the wafer 105 so as to conform to the shape of the mold 103. The wafer 105 may also be deformed under the control of the mold holding mechanism 117.

Fourth Embodiment

Next, a description will be given of an imprint method and an imprint apparatus according to a fourth embodiment of the present invention. In the first to third embodiments, a description has been given of the case where the shape of the mold 103 and the shape of the wafer 105 are deformed by using an air pressure (first embodiment), a mechanical external force (second embodiment), or a remote force (third embodiment). In contrast, the feature of the present embodiment lies in the fact that a change in shape of the mold 103 is performed due to a difference in rigidity between the X-direction and the Y-direction of the outer periphery of the mold 103. In the following embodiment, the components corresponding to or similar to those in the above embodiments are designated by the same reference numerals, and therefore, its explanation will be omitted.

Figure 10:
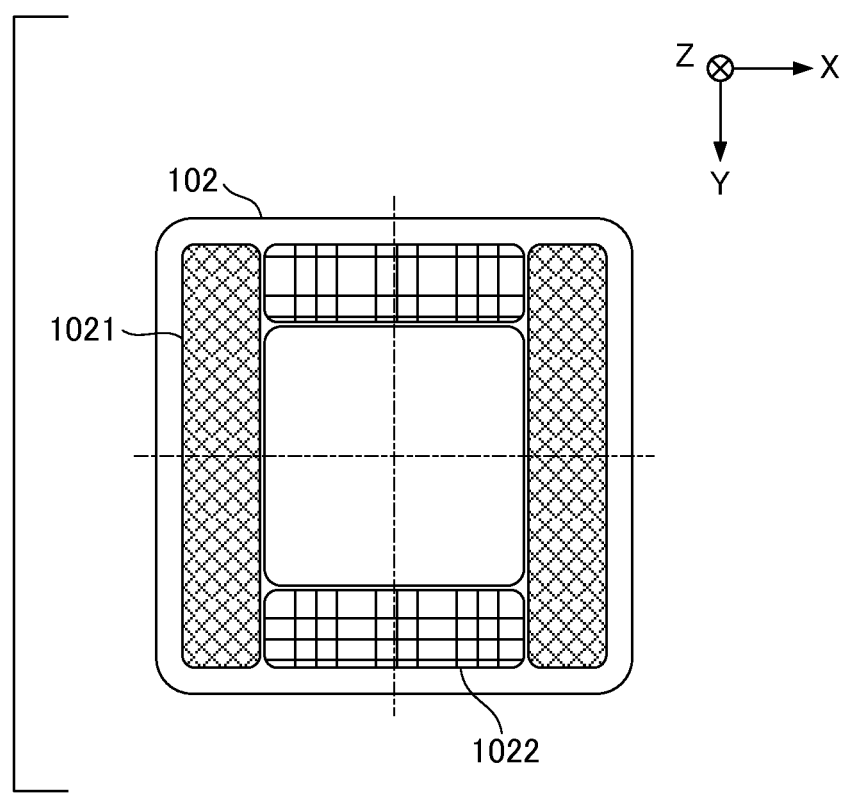
FIG. 10 is a diagram illustrating a mold chuck used in an imprint apparatus according to a fourth embodiment of the present invention.

FIG. 10 is a diagram illustrating a configuration of the mold chuck 102 used in the imprint method and the imprint apparatus according to the present embodiment. The mold chuck 102 differs from the above embodiments in that a first mold holding unit 1021 and a second mold holding unit 1022 are provided on a contact surface with the mold 103 at locations surrounding the aperture region. The first mold holding unit 1021 has an elongated shape along the Y-direction in FIG. 10 and the second mold holding unit 1022 has an elongated shape along the X-direction in FIG. 10. The first mold holding unit 1021 and the second mold holding unit 1022 are vacuum chucks which are independently capable of switching the suction and release with respect to the mold 103. Note that the mold 103 for use in the present embodiment consists of synthetic quartz having a thickness of 1 mm and has a square of 100 mm square in the longitudinal and transverse directions as viewed from the above.

FIG. 11 is a schematic plan view illustrating a change in state of the resin 104 at a time interval due to contact between the mold 103 and the resin 104 on the wafer 105. FIG. 12 is a schematic cross-sectional view illustrating the states (shapes) of the mold 103, the wafer 105, and the resin 104 on the wafer 105 in a time series manner in a sequence of steps of the above imprint processing. The coordinate axes and the directions of the arrows mean the same as those in the first embodiment. FIG. 11A is a diagram illustrating a state before the mold 103 is brought into contact with the resin 104. At this time, as shown in FIG. 12A, the rear surface of the mold 103 is sucked to the mold chuck 102 by means of the first mold holding unit 1021 and the second mold holding unit 1022. The central portion of the pattern portion 103a is deformed into a substantially spherical convex shape by the mold shape variable mechanism 114 so as to come closer to the resin 104 side.

Figure 11A:
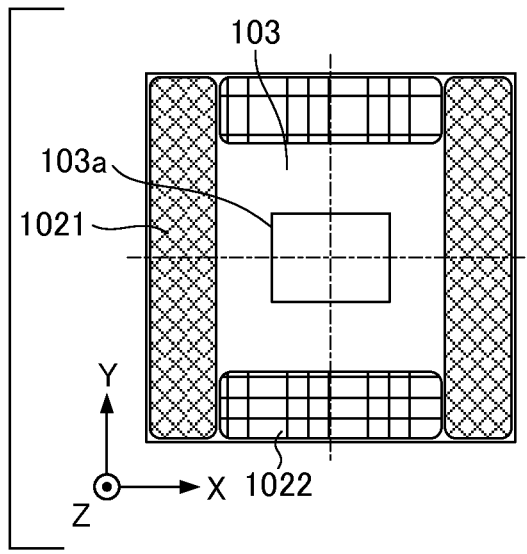
FIG. 11A is a diagram illustrating a state before a mold is brought into contact with a resin.
Figure 11B:
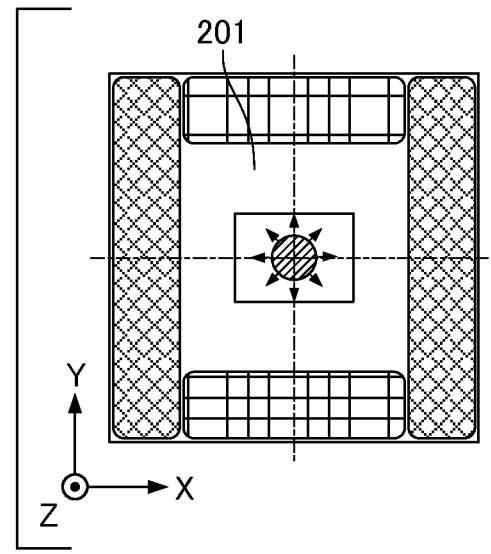
FIG. 11B is a diagram illustrating a state where a mold is in contact with a resin.
Figure 11C:
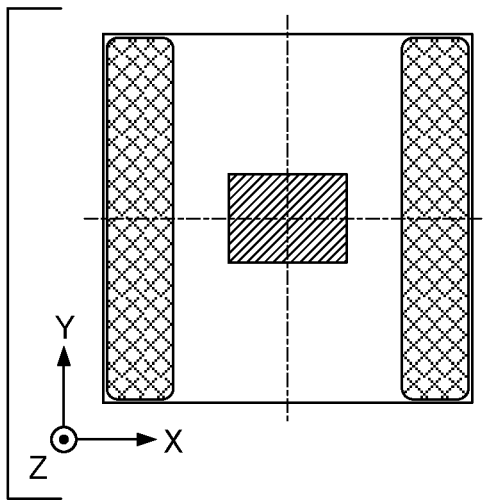
FIG. 11C is a diagram illustrating a state where a mold is completely filled with a resin by bringing the mold into contact with the resin.
Figure 12:
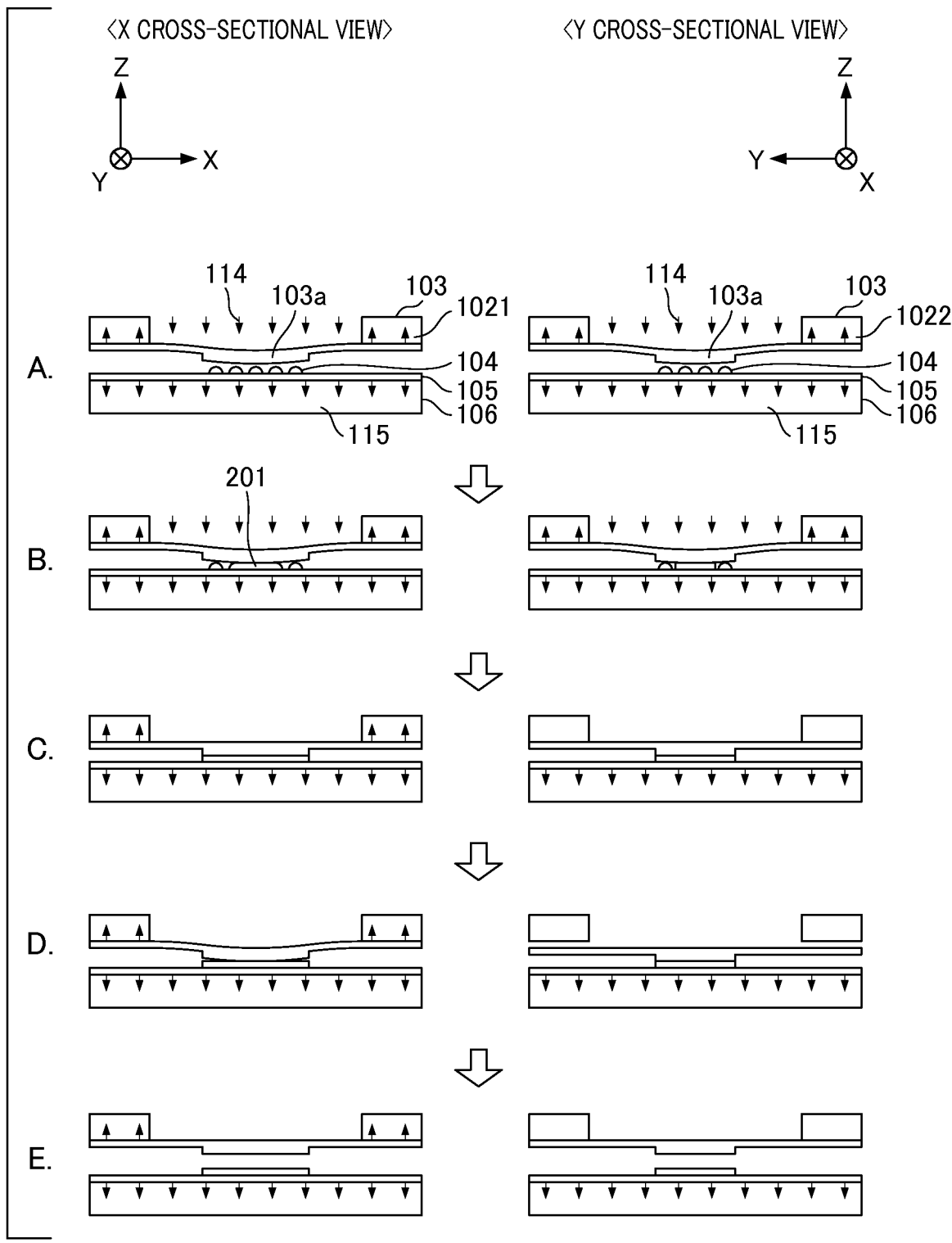
FIG. 12 is a diagram illustrating a state of the components or the like during imprint processing in a time series manner.

FIGS. 11B and 12B are diagrams illustrating the state where the pattern portion 103a starts to come into contact with the resin 104. As in the above embodiments, the contact region 201 becomes a substantially circular shape, so that the resin filling isotropically progresses from the central region towards the outer peripheral region of the pattern portion 103a. FIGS. 11C and 12C are diagrams illustrating the state where the resin 104 is completely filled over the entire pattern portion 103a. As in the first embodiment, the resin 104 is cured under the control of the mold shape variable mechanism 114. Subsequently, the rear surface of the mold 103 is sucked to the mold chuck 102 by means of the first mold holding unit 1021 alone. This causes the rigidity of the outer periphery of the mold 103 in the Y-direction to be higher than that in the X-direction.

Figure 11D:
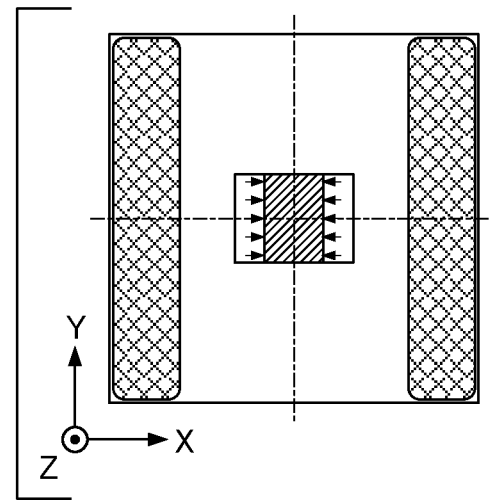
FIG. 11D is a diagram illustrating a state where a mold is in contact with a resin upon start of a mold-releasing step.
Figure 11E:
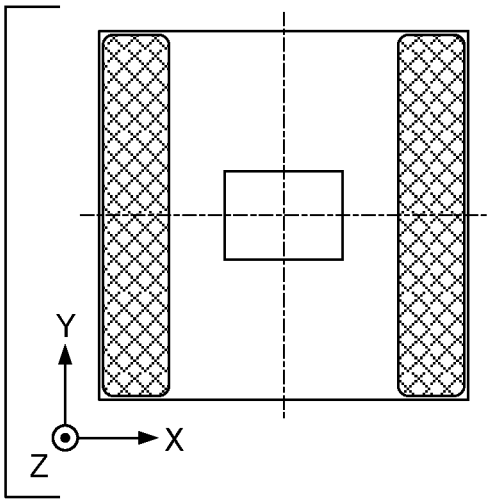
FIG. 11E is a diagram illustrating a state where a mold-releasing step is complete.

FIGS. 11D and 12D are diagrams illustrating the state where the mold-releasing step is in progress. Unlike the above embodiments, neither the wafer shape variable mechanism 115 nor the mold shape variable mechanism 114 is used. As shown in FIG. 12D, the mold-releasing step progresses while the pattern portion 103a is deformed into a substantially cylindrical shape extending in the Y-direction in FIG. 11D. At this time, the peeling interfaces formed in two linear lines and parallel to each other in the Y axis as shown in FIG. 11D occur between the pattern portion 103a and the resin 104, and then, peeling progresses such that the peeling interfaces come closer to each other. FIGS. 11E and 12E are diagrams illustrating the state where the mold-releasing step is completed. The mold-releasing force applied for deformation of the mold 103 is lost, so that the shape of the mold 103 is returned to its original state. The imprint apparatus having the above configuration also provides the same effect as in the above embodiments.

In the present embodiment, a typical object having a planar shape may be used as the mold 103. Thus, the present embodiment is particularly suitable for the case where the manufacturing cost for the mold 103 is desired to be reduced, the case where a material difficult to be machined such as sapphire is used as a mold, or the like.

Fifth Embodiment

Next, a description will be given of an imprint method and an imprint apparatus according to a fifth embodiment of the present invention. In the fourth embodiment, there is a difference in rigidity between the X-direction and the Y-direction of the outer periphery of the mold 103 due to the configuration of the mold chuck 102. In contrast, the feature of the present embodiment lies in the fact that there is a difference in rigidity due to the configuration of the mold 103 itself.

FIG. 13 is a schematic plan view illustrating a change in state of the resin 104 at a time interval due to contact between the mold 103 and the resin 104 on the wafer 105. FIG. 14 is a schematic cross-sectional view illustrating the states (shapes) of the mold 103, the wafer 105, and the resin 104 on the wafer 105 in a time series manner in a sequence of steps of the above imprint processing. The coordinate axes and the directions of the arrows mean the same as those in the first embodiment. FIG. 13A is a diagram illustrating a state before the mold 103 is brought into contact with the resin 104. At this time, as shown in FIG. 14A, the central portion of the pattern portion 103a is deformed into a substantially spherical convex shape by the mold shape variable mechanism 114 so as to come closer to the resin 104 side. The wafer 105 is deformed into a cylindrical convex shape extending in the X-direction in FIG. 14A by the wafer shape variable mechanism 115 so as to come closer to the resin 104 side.

Figure 13A:
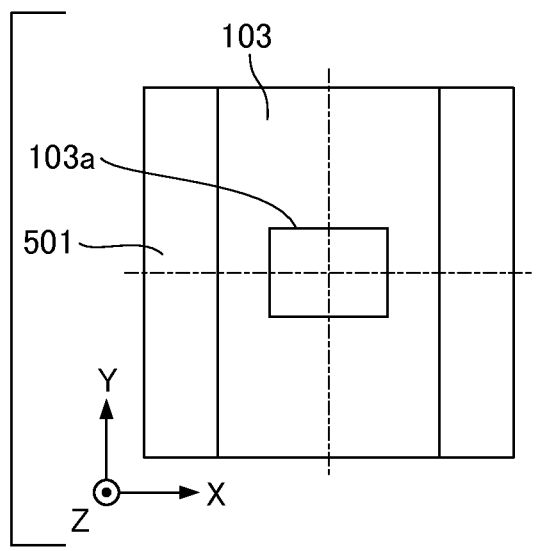
FIG. 13A is a diagram illustrating a state before a mold is brought into contact with a resin.
Figure 14:
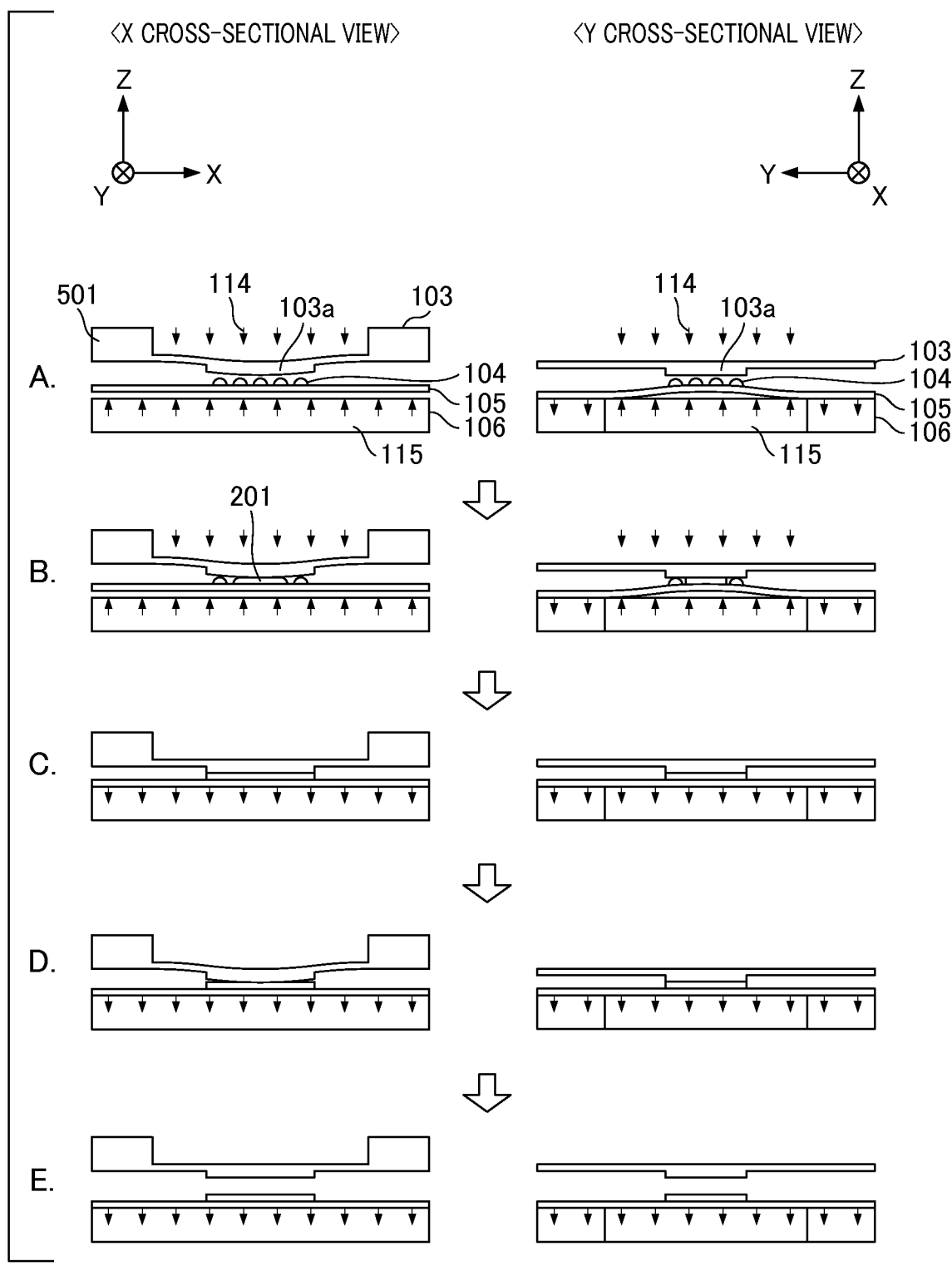
FIG. 14 is a diagram illustrating a state of the components or the like during imprint processing in a time series manner.
Figure 15:
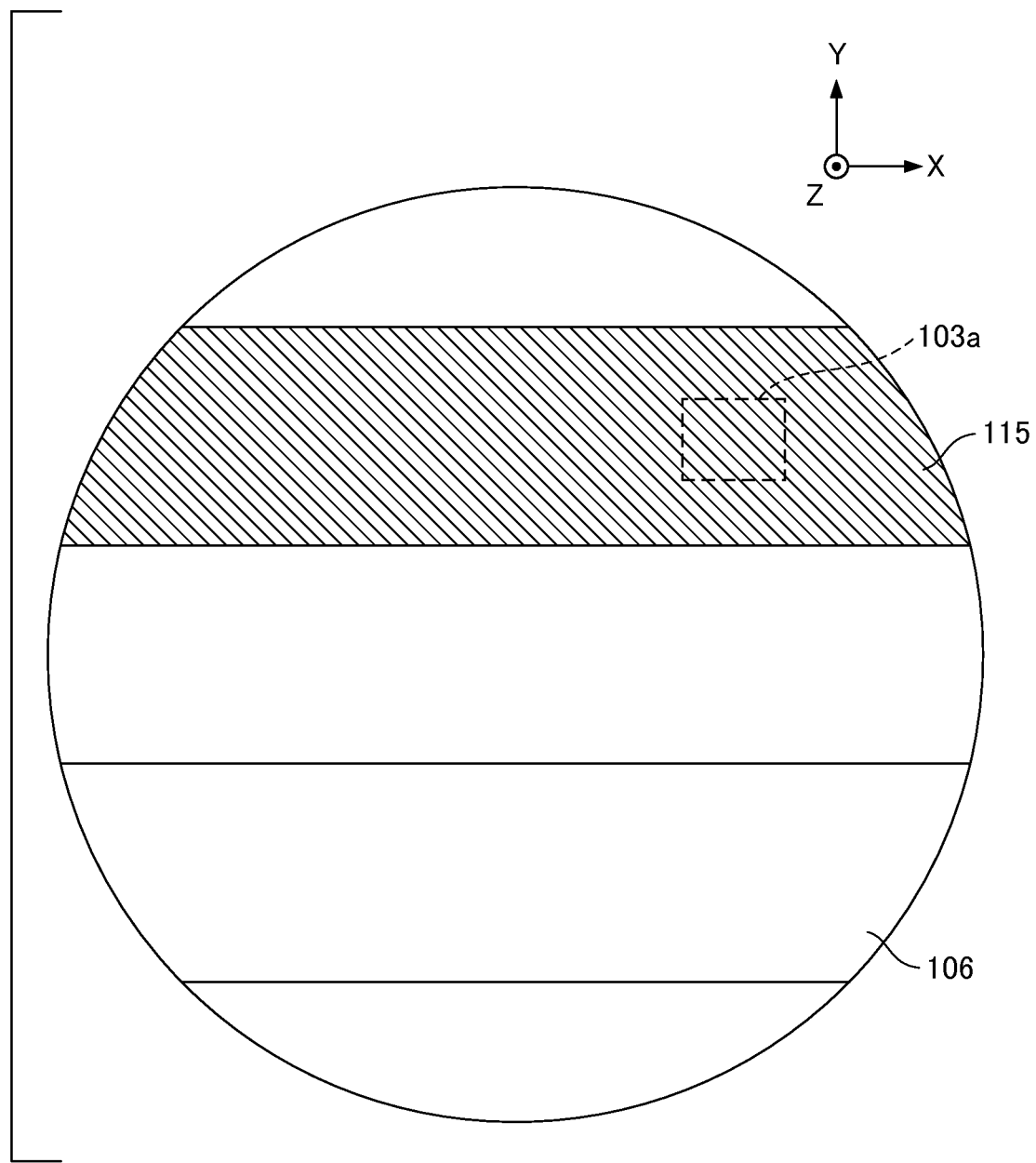
FIG. 15 is a diagram illustrating a substrate chuck.

Among the four sides of the mold 103, two opposing sides that are parallel to each other in the Y-direction in FIG. 13A are two high-rigidity portions 501 having an increased rigidity with an increase in thickness. Each of the high-rigidity portions 501 has a dimension of a thickness of 10 mm and a width of 20 mm. This structure enables the rigidity of the outer periphery of the mold 103 in the Y-direction to be higher than that in the X-direction. The mold chuck 102 is a mechanical chuck that mechanically constrains the high-rigidity portions 501. Furthermore, a rubber bellows (not shown) prevents gas from being entered from the end surface of the thin portion of the mold 103 towards the Y-direction in FIG. 13A. The substrate chuck 106 is a vacuum chuck. As shown in FIG. 15, the substrate chuck 106 has a structure in which the X and Y axes are inversed with respect to those in FIG. 9.

Figure 13B:
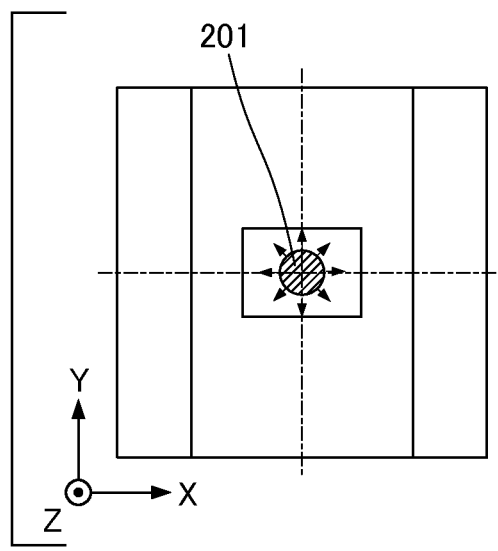
FIG. 13B is a diagram illustrating a state where a mold is in contact with a resin.
Figure 13C:
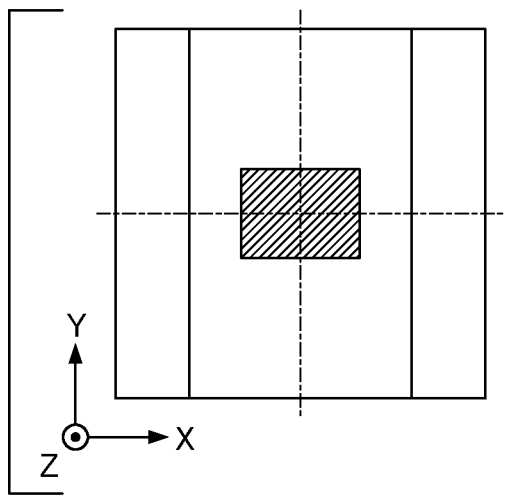
FIG. 13C is a diagram illustrating a state where a mold is completely filled with a resin by bringing the mold into contact with the resin.

FIGS. 13B and 14B are diagrams illustrating the state where the pattern portion 103a starts to come into contact with the resin 104. As in the above embodiments, the contact region 201 becomes a substantially circular shape, so that the resin filling isotropically progresses from the central region towards the outer peripheral region of the pattern portion 103a. FIGS. 13C and 14C are diagrams illustrating the state where the resin 104 is completely filled over the entire pattern portion 103a. As in the above embodiments, the resin 104 is cured by UV-light irradiation after completion of filling. Subsequently, the mold shape variable mechanism 114 stops a force exerted thereby on the mold 103, and then, the entire rear surface of the wafer 105 is sucked to the wafer chuck 106.

Figure 13D:
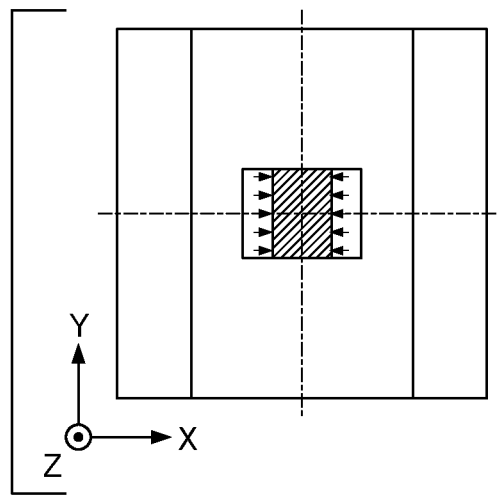
FIG. 13D is a diagram illustrating a state where a mold is in contact with a resin upon start of a mold-releasing step.
Figure 13E:
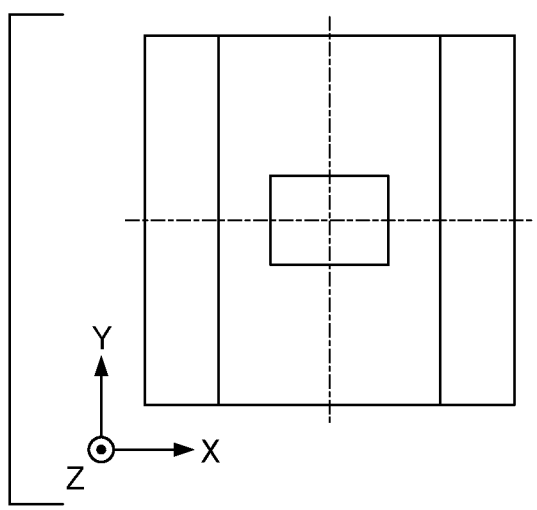
FIG. 13E is a diagram illustrating a state where a mold-releasing step is complete.

FIGS. 13D and 14D are diagrams illustrating the state where the mold-releasing step is in progress. As shown in FIG. 14D, the mold-releasing step progresses while the pattern portion 103a is deformed into a substantially cylindrical shape extending in the Y-direction in FIG. 14D. At this time, the peeling interfaces formed in two linear lines and parallel to each other in the Y axis as shown in FIG. 13D occur between the pattern portion 103a and the resin 104, and then, peeling progresses such that the peeling interfaces come closer to each other. FIGS. 11E and 12E are diagrams illustrating the state where the mold-releasing step is completed. The mold-releasing force applied for deformation of the mold 103 is lost, so that the shape of the mold 103 is returned to its original state. The imprint apparatus having the above configuration also provides the same effect as in the above embodiments.

In the present embodiment, the high-rigidity portions 501 of the mold 103 may be utilized as a so-called "clamping margin". Thus, the present embodiment is particularly suitable for the case where a vacuum chuck or an electrostatic chuck is disengaged due to a particularly large mold-releasing force, the case where molding is performed in vacuum, or the case where a robust mechanical constraint is desired to be performed.

Sixth Embodiment

Next, a description will be given of an imprint method and an imprint apparatus according to a sixth embodiment of the present invention. In the fifth embodiment, among the four sides of the mold 103, the rigidity of the outer periphery of the mold 103 in the Y-direction is set to be higher than that in the X-direction with an increase in thickness of two opposing sides that are parallel to each other in the Y-direction. In contrast, the feature of the present embodiment lies in the fact that a difference in rigidity of the outer periphery of the mold 103 is small between in the X-direction and in the Y-direction but a certain rigidity is ensured at the outer periphery of the mold 103 in the X-direction.

FIG. 16 is a schematic plan view illustrating a change in state of the resin 104 at a time interval due to contact between the mold 103 and the resin 104 on the wafer 105. FIG. 17 is a schematic cross-sectional view illustrating the states (shapes) of the mold 103, the wafer 105, and the resin 104 on the wafer 105 in a time series manner in a sequence of steps of the above imprint processing. The coordinate axes and the directions of the arrows mean the same as those in the first embodiment. FIG. 16A is a diagram illustrating a state before the mold 103 is brought into contact with the resin 104. At this time, as shown in FIG. 17A, the mold 103 is deformed into a substantially elliptical shape, which is convex towards the resin 104 and whose major axis extends along the Y-direction in FIG. 16A, by the mold shape variable mechanism 114. Unlike the above embodiments, the mold 103 does not become a cylindrical shape due to a difference in rigidity thereof.

Figure 16A:
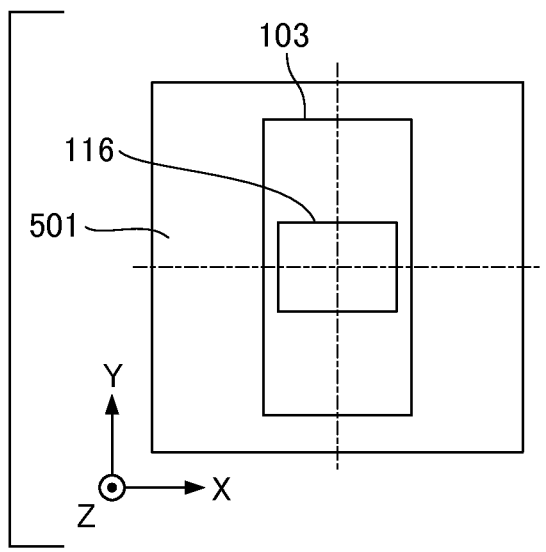
FIG. 16A is a diagram illustrating a state before a mold is brought into contact with a resin.
Figure 17:
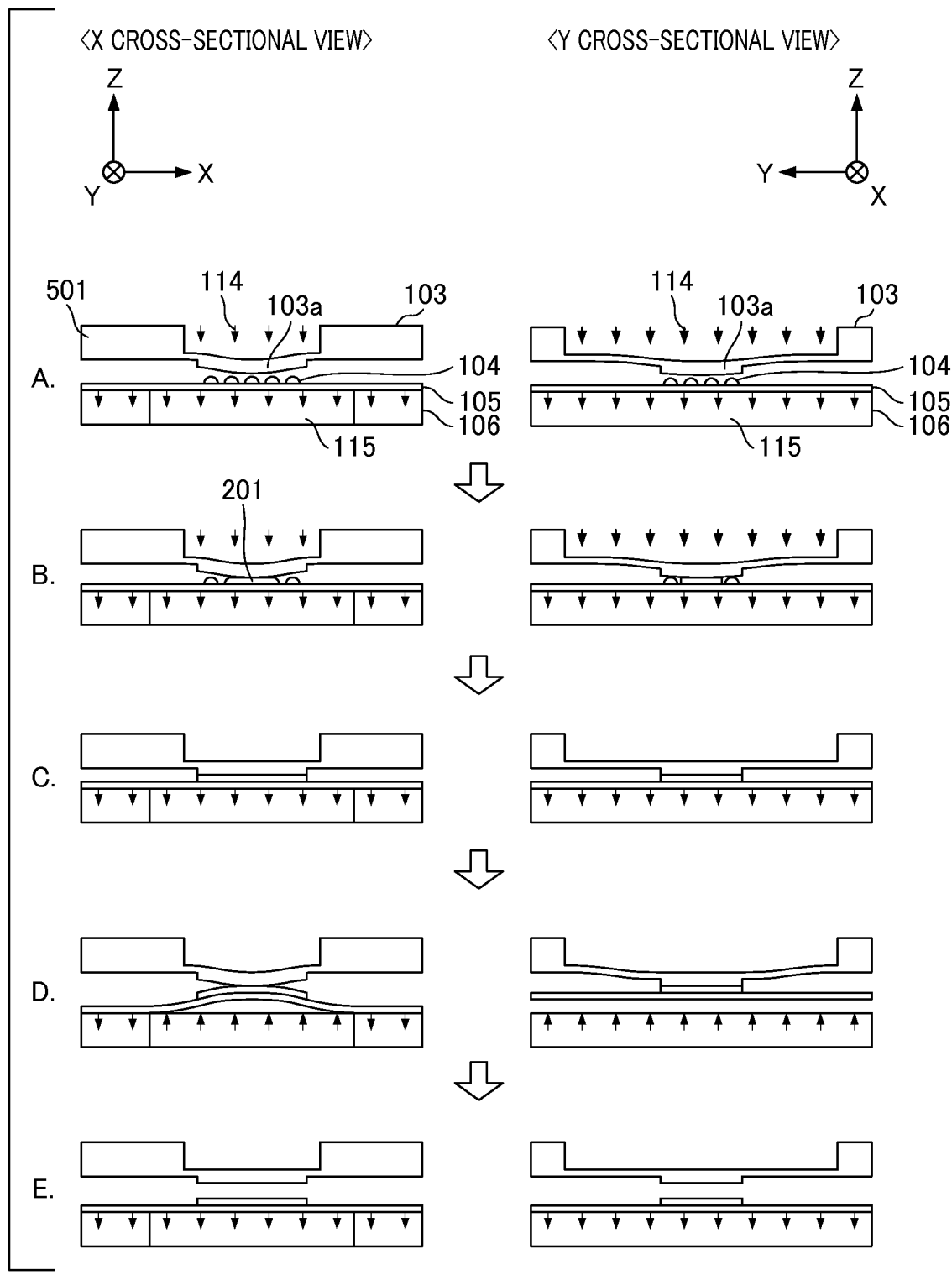
FIG. 17 is a diagram illustrating a state of the components or the like during imprint processing in a time series manner.

Among the four sides of the mold 103 in the present embodiment, each of the high-rigidity portions 501 provided at two opposing sides that are parallel to each other in the Y-direction in FIG. 16A has a dimension of a thickness of 10 mm and a width of 30 mm and each of the high-rigidity portions 501 provided at two opposing sides that are parallel to each other in the X-direction in FIG. 16A has a dimension of a thickness of 10 mm and a width of 10 mm. The rigidity of the outer periphery of the mold 103 in the Y-direction is higher than that in the X-direction due to a difference in width between the high-rigidity portions 501 in the X-direction and the Y-direction. Note that a difference in rigidity is not present as well as that in the fifth embodiment. The mold chuck 102 is a vacuum chuck that holds the high-rigidity portions 501 by suction. The substrate chuck 106 is a vacuum chuck having the configuration shown in FIG. 9.

Figure 16B:
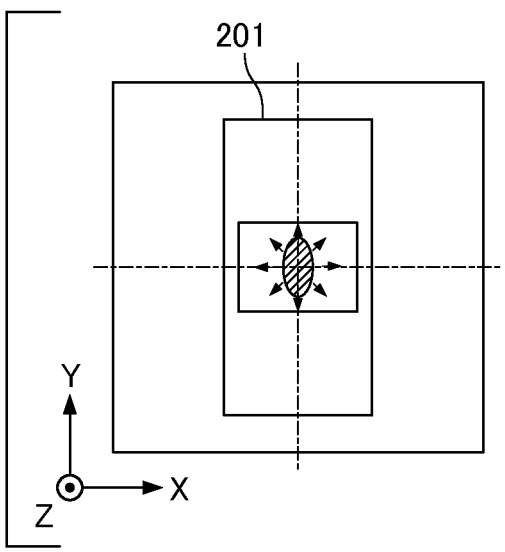
FIG. 16B is a diagram illustrating a state where a mold is in contact with a resin.
Figure 16C:
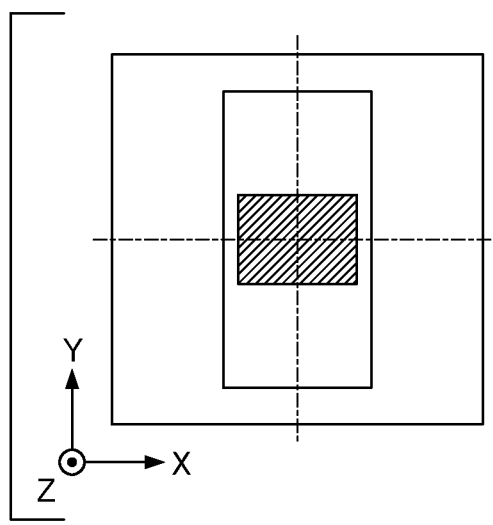
FIG. 16C is a diagram illustrating a state where a mold is completely filled with a resin by bringing the mold into contact with the resin.

FIGS. 16B and 17B are diagrams illustrating the state where the pattern portion 103*a* starts to come into contact with the resin 104. The contact region 201 becomes a substantially elliptical shape whose major axis extends along the Y-direction in FIG. 16B, so that the resin filling isotropically progresses from the central region towards the outer peripheral region of the pattern portion 103*a*. FIGS. 16C and 17C are diagrams illustrating the state where the resin 104 is completely filled over the entire pattern portion 103*a*. As in the above embodiments, the resin 104 is cured by UV-light irradiation after completion of filling. Subsequently, the mold shape variable mechanism 114 stops a force exerted thereby on the mold 103. In the steps so far described, the entire rear surface of the wafer 105 is sucked to the wafer chuck 106.

Figure 16D:
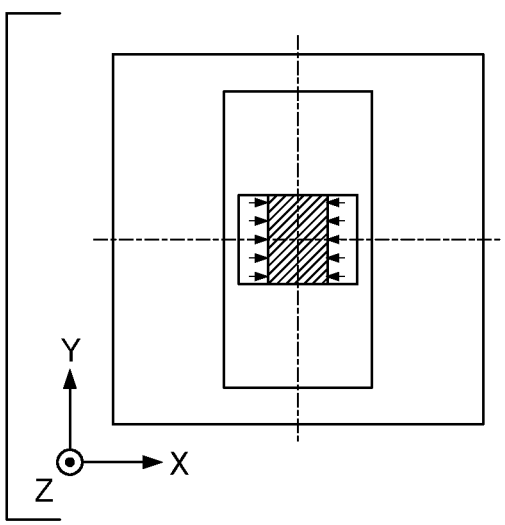
FIG. 16D is a diagram illustrating a state where a mold is in contact with a resin upon start of a mold-releasing step.
Figure 16E:
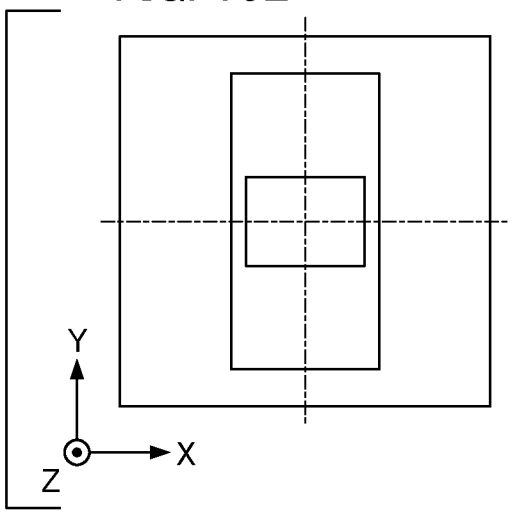
FIG. 16E is a diagram illustrating a state where a mold-releasing step is complete.

FIGS. 16D and 17D are diagrams illustrating the state where the mold-releasing step is in progress. As shown in FIG. 17D, the mold 103 is deformed into a substantially elliptical shape which is convex as viewed from the resin 104 and, the mold-releasing step progresses while the wafer 105 is deformed into a substantially cylindrical shape extending in the Y-direction in FIG. 16D. At this time, the wafer shape variable mechanism 115 applies a force to the wafer 105 in the Z axis direction. The difference in amount of deformation of the mold 103 due to a difference in rigidity thereof is supplemented by the amount of deformation of the wafer 105, the peeling interfaces formed in two linear lines and parallel to each other in the Y axis as shown in FIG. 16D occur between the pattern portion 103*a* and the resin 104, and then, peeling progresses such that the peeling interfaces come closer to each other. FIGS. 16E and 17E are diagrams illustrating the state where the mold-releasing step is completed. The mold-releasing force applied for deformation of the mold 103 is lost, so that the shape of the mold 103 is returned to its original state. The imprint apparatus having the above configuration also provides the same effect as in the above embodiments.

Since the entire periphery of the mold 103 is constituted by the high-rigidity portions 501 in the present embodiment, the mold 103 exhibits a very high rigidity as a whole. Thus, when a high positional accuracy is particularly required for the entire pattern, the present embodiment is particularly suitable for the case where the strain in the mold 103 due to a strong holding force of the mold chuck 102 causes a problem.

Note that the wafer 105 may be selected instead of the mold 103 as a member having a difference in rigidity or both the mold 103 and the wafer 105 may have a difference in rigidity. When peeling interfaces are not sufficiently linear lines, the mold 103 and the wafer 105 may also be auxiliary deformed. As a method for making a difference in rigidity, a method for adjusting the thickness of the mold 103 (a method for providing a distribution in thickness of the mold 103) may be used in combination with a method for adjusting a suction force produced by the mold chuck 102.

(Article Manufacturing Method)

A method for manufacturing a device (semiconductor integrated circuit element, liquid display element, or the like) as an article may include a step of forming a pattern on a substrate (wafer, glass plate, film-like substrate, or the like) using the imprint apparatus described above. Furthermore, the manufacturing method may include a step of etching the substrate on which a pattern has been formed. When other articles such as a patterned medium (storage medium), an optical element, or the like are manufactured, the manufacturing method may include another step of processing the substrate on which a pattern has been formed instead of the etching step. The device manufacturing method of the present embodiment has an advantage, as compared with a conventional method, in at least one of performance, quality, productivity and production cost of an article.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-229177 filed on Nov. 11, 2014, and Japanese Patent Application No. 2015-172018 filed on Sep. 1, 2015 which are hereby incorporated by reference herein in its entirety.

What is claimed is:

1. An imprint method for forming a pattern on an imprint material applied to a substrate with use of a mold, the imprint method comprising a step of:
    releasing the mold from the imprint material after curing the imprint material, by deforming at least one of the substrate or the mold, such that two opposed boundaries, at which the mold is peeled from the imprint material, are brought closer to each other in a plan view viewed via the mold, while maintaining a linear state of the two opposed boundaries, and maintaining lengths of each of the two opposed boundaries constant.

2. The imprint method according to claim 1, wherein, in the step, the mold is deformed into a convex shape along a cylindrical shape having an axis extending in parallel to the plane of the mold and towards the substrate as viewed from the direction of the axis in the boundaries.

3. The imprint method according to claim 2, wherein, in the step, the substrate is deformed into a concave shape corresponding to the convex shape of the mold.

4. The imprint method according to claim 1, wherein, in the step, the substrate is deformed into a convex shape along a cylindrical shape having an axis extending in parallel to the plane of the substrate and towards the mold as viewed from the direction of the axis of the boundaries.

5. The imprint method according to claim 4, wherein, in the step, the mold is deformed into a concave shape corresponding to the convex shape of the mold.

6. The imprint method according to claim 1, wherein, in the step, the mold is deformed when being released from the imprint material by adjusting the rigidity of the mold.

7. The imprint method according to claim 6, wherein the rigidity of the mold is adjusted by suction force of a mold holder for holding the mold.

8. The imprint method according to claim 6, wherein the rigidity of the mold is adjusted by the thickness of the mold.

9. The imprint method according to claim 1, wherein, in the step, at least one of the mold or the substrate is deformed by using a fluid pressure when releasing the mold from the imprint material.

10. The imprint method according to claim 1, wherein, in the step, at least one of the mold or the substrate is deformed by using an external force caused by contact when releasing the mold from the imprint material.

11. The imprint method according to claim 1, wherein, in the step, at least one of the mold or the substrate is deformed by using a remote force caused by an electric field or a magnetic field when releasing the mold from the imprint material.

12. A method for manufacturing an article, the method comprising steps of:
forming a pattern on a substrate using an imprint method for forming the pattern on an imprint material applied to the substrate with use of a mold; and
processing the substrate on which the pattern formation has been performed in the forming,
wherein the imprint method comprises a step of releasing the mold from the imprint material after curing the imprint material, by deforming at least one of the substrate or the mold, such that two opposed boundaries, at which the mold is peeled from the imprint material are brought closer to each other in a plan view as viewed via the mold, while maintaining a linear state of the two opposed boundaries, and maintaining lengths of each of the two opposed boundaries constant.

13. A method for manufacturing an article, the method comprising steps of:
forming a pattern on a substrate using an imprint method for forming the pattern on an imprint material applied to the substrate with use of a mold; and
processing the substrate on which the pattern formation has been performed in the forming, and
wherein the imprint apparatus comprises:
a mold holder configured to hold the mold;
a substrate holder configured to hold the substrate;
a mold shape deforming unit configured to deform the mold being held by the mold holder;
a substrate shape deforming unit configured to deform the substrate being held by the substrate holder; and
a controller configured to control at least one of the mold holder, the mold shape deforming unit, the substrate holder, or the substrate shape deforming unit for deforming at least one of the substrate or the mold after curing the imprint material, such that two opposed boundaries, at which the mold is peeled from the imprint material are brought closer to each other in a plan view as viewed via the mold, while maintaining a linear state of the two opposed boundaries, and maintaining lengths of each of the two opposed boundaries constant upon releasing the mold from the material.

* * * * *